(12) United States Patent  (10) Patent No.: US 7,901,851 B2
Mizukawa et al.  (45) Date of Patent: *Mar. 8, 2011

(54) COLORED CURABLE COMPOSITION, COLOR FILTER AND METHOD OF PRODUCING THEREOF

(75) Inventors: Yuki Mizukawa, Kanagawa (JP); Toru Fujimori, Shizuoka-ken (JP); Yasuhiro Kato, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1143 days.

This patent is subject to a terminal disclaimer.

(21) Appl. No.: 11/601,635

(22) Filed: Nov. 20, 2006

(65) Prior Publication Data

US 2007/0117031 A1     May 24, 2007

(30) Foreign Application Priority Data

Nov. 18, 2005    (JP) ................ 2005-334977

(51) Int. Cl.
  *G02B 5/20* (2006.01)
  *G03F 7/00* (2006.01)
(52) U.S. Cl. .......................... 430/7; 430/270.1
(58) Field of Classification Search .................. None
  See application file for complete search history.

(56) References Cited

U.S. PATENT DOCUMENTS 7,622,521 B2 * 11/2009 Seto ............................. 524/100
2005/0175908 A1   8/2005 Seto et al.

FOREIGN PATENT DOCUMENTS

| JP | 2005-099677 A | 4/2005 |
| JP | 2005-213357 A | 8/2005 |
| JP | 2005-215286 A | 8/2005 |
| JP | 2005-281329 A * | 10/2005 |

OTHER PUBLICATIONS

Computer-generated translation of JP 2005-218329 (Oct. 2005).*
Search Results for U.S. Appl. No. 11/599,403 (issued as Patent No. 7,622,521) dated Feb. 13, 2009.

* cited by examiner

*Primary Examiner* — John A. McPherson
(74) *Attorney, Agent, or Firm* — Sughrue Mion, PLLC

(57) ABSTRACT

A dye polymer prepared by polymerizing one or more pigment monomer represented by formula (I), or a dye polymer prepared by copolymerizing one or more pigment monomer represented by formula (I) and one or more monomer having one ethylene group.
[$R^1$: H, chlorine atom, alkyl group, or aryl group; $L^1$: —N($R^2$)C(=O)—, —OC(=O)—, —C(=O)N($R^2$)—, —C(=O)O—, or a group represented by formula (II), formula (III), or formula (IV); $R^2$: H, alkyl group, aryl group, or hetero cyclic group; $L^2$: divalent coupler for coupling $L^1$ and Dye; n=0 or 1, m=0 or 1; Dye: pigment residue]

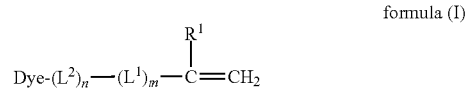

formula (I)

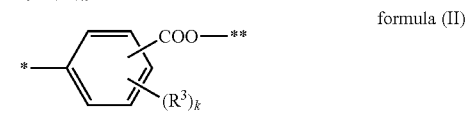

formula (II)

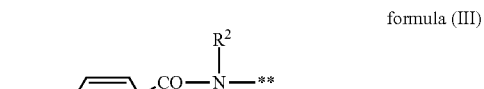

formula (III)

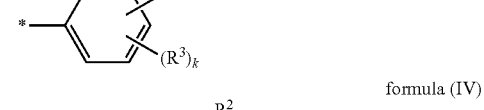

formula (IV)

11 Claims, No Drawings

COLORED CURABLE COMPOSITION, COLOR FILTER AND METHOD OF PRODUCING THEREOF

CROSS-REFERENCE TO RELATED APPLICATION

This application claims priority under 35 USC 119 from Japanese patent Application Nos. 2005-334977, the disclosures of which are incorporated by reference herein.

BACKGROUND OF THE INVENTION (i) Field of the Invention

The present invention relates to a colored curable composition constituting a color filter used for liquid crystal display elements and solid state image pick-up elements and suitable for forming colored images, as well as to a color filter using the colored curable composition and a process of preparing the color filter.

(ii) Description of the Related Art

As processes for preparing a color filter used for liquid crystal display elements and solid state image pick-up elements, a staining process, a printing process, an electrodeposition process and a pigment dispersion process are known.

In the pigment dispersion process, the color filter is prepared by a photolithographic process using a colored radiation-sensitive composition prepared by dispersing a pigment in a photosensitive composition. A sufficient degree of positional accuracy can be obtained in this process since the pigment is patterned by the photolithographic process, and this process has been widely used as a process suitable for preparing the color filter for a large screen and high accuracy color display.

In preparing a color filter by the pigment dispersion process, the radiation-sensitive composition is first coated on a support with a spin coater or roll coater and dried to form a coating film. Then, colored pixels are obtained by patterned-exposure and development of the coating film. The color filter can be prepared by repeating this operation a number of times corresponding to the number of hues.

The above pigment dispersion process proposes use of a negative photosensitive composition using together a photo polymerizable monomer, a photopolymerization initiator, and an alkali-soluble resin (e.g., see, Japanese Patent Application Laid-Open (JP-A) Nos. 2-199403).

Recently there is a need to further increase the high-definition of color filters for solid state image pick-up elements. In conventional pigment dispersion processes, however, it is difficult to enhance the resolution further, and there are problems such as color unevenness due to the coarse particles of pigments. They are not suited to uses demanding fine patterns, such as solid state image pick-up elements.

In the light of such problems, it has been hitherto proposed to use a dye instead of a pigment (e.g., see, JP-A No. 6-75375). Further reductions in layer thickness are desired in color filters for solid state image pick-up elements. In order to satisfy both sufficient coloring concentration and layer thinness, a large amount of coloring agent (dye) needs to be added to the photosensitive composition, with decreases in the content of other materials in the composition. When a dye is used as a coloring agent, tolerance to organic solvents is insufficient. When a subsequent color pattern is coated superposed on a pattern that has already been formed, the problem that the dye in the pattern may elute (referred to as "decoloring") may occur. In the photosensitive composition, for example, when the amount of an organic solvent soluble dye is increased, and the amount of other materials is decreased, the dye in the pattern that has already formed may elute significantly when a subsequent color pattern is coated (e.g., see, JP-A No. 2004-246106).

SUMMARY OF THE INVENTION

The invention provides a dye polymer excellent in thermal resistance and light resistance, and also excellent in ability not to precipitate out when prepared as a dissolved solution. The invention also provides a colored curable composition excellent in thermal resistance, light resistance, and stability over time, and suppressed elution (decoloring) of the dye in a pattern when a subsequent color pattern is coated superimposed onto a pattern that has already been formed. The invention further provides a color filter excellent in thermal resistance and light resistance, and a method of producing the same.

The invention is based on a following findings. That is, the finding that a particular structure of dye has excellent thermal resistance and light resistance, and is capable of suppressing decoloring, when a subsequent color pattern is coated superposed onto a pattern that has already been formed, when the amount of organic solvent soluble dye is increased and the amount of other materials is decreased.

A first aspect of the invention provides a dye polymer prepared by polymerizing one or more pigment monomer represented by formula (I), or by copolymerizing one or more pigment monomer represented by formula (I) and one or more monomer having one ethylene group,

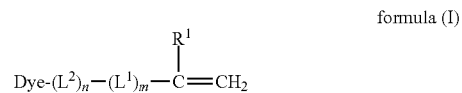

formula (I)

wherein in formula (I): $R^1$ is a hydrogen atom, a chlorine atom, an alkyl group, or an aryl group; $L^1$ is —N($R^2$)C(=O)—, —OC(=O)—, —C(=O)N($R^2$)—, —C(=O)O—, or a group represented by formula (II), formula (III), or formula (IV); $R^2$ is a hydrogen atom, an alkyl group, an aryl group, or a hetero cyclic group; $L^2$ is a divalent group for coupling $L^1$ or —C($R^1$)=$CH_2$ group and Dye; n is 0 or 1; m is 0 or 1; and Dye is a pigment residue obtained by removing one arbitrary hydrogen atom from a group represented by formula (V),

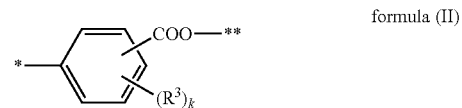

formula (II)

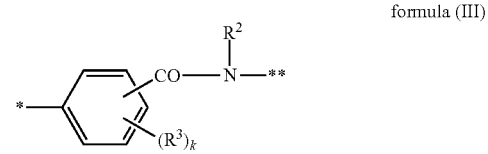

formula (III)

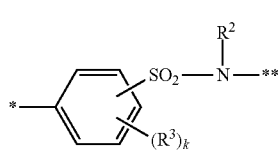

formula (IV)

wherein in formulas (II), (III) and (IV): $R^2$ is a hydrogen atom, an alkyl group, an aryl group, or a hetero cyclic group; $R^3$ is a substituent; k is an integer from 0 to 4; "*" is a coupling position with —$C(R^1)$=$CH_2$ group in formula (I); "**" is a coupling position with $L^2$ or Dye (in the case of n=0) in formula (I),

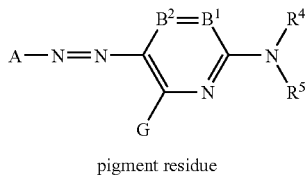

formula (V)

pigment residue wherein in formula (V): A is an aryl, or a 5- or 6-membered aromatic hetero cyclic residue; $B^1$ and $B^2$ are each independently =N— or =$CR^6$—; $R^6$ is a hydrogen atom or a substituent; $R^4$ and $R^5$ are each independently a hydrogen atom, an alkyl group, an aryl group, a hetero cyclic group, an acyl group, an alkoxycarbonyl group, an aryloxycarbonyl group, a carbamoyl group, an alkylsulfonyl group, an arylsulfonyl group, or a sulfamoyl. group; G is a hydrogen atom or a substituent; $R^4$ and $R^6$, or $R^4$ and $R^5$ may be coupled to form a 5- to 7-memberd ring, and any one of A, G, $R^4$, $R^5$, or $R^6$ is coupled with -$(L^2)_n$-$(L^1)_m$-$C(R^1)$=$CH_2$ in formula (I).

A second aspect of the invention provides a colored curable composition comprising at least one of the dye polymers according to the first aspect.

A third aspect of the invention provides a color filter formed by using the colored curable composition according to the second aspect.

A fourth aspect of the invention provides a method of producing a color filter comprising: coating the colored curable composition according to the second aspect onto a support; then exposing through a mask; and developing to form a patterned image.

DETAILED DESCRIPTION OF THE INVENTION

The dye polymer, colored curable composition, color filter, and the method of producing thereof of the invention are specifically described below.

<<Dye Polymer>>

The dye polymer of the invention is obtained by polymerizing one or more pigment monomer represented by formula (I), or by copolymerizing the one or more pigment monomer represented by formula (I) and one or more monomer having one ethylene group.

The dye polymer of the invention obtained from the pigment monomer has excellent color hue, organic solvent solubility, high transmission characteristic, and excellent thermal resistance and light-fastness. Further, the dye polymer of the invention is free from deposition over time when formed as liquid preparation or coated film, and is superior in stability over time.

Accordingly, when the dye polymer is contained in the colored curable composition, an image (in particular, red and magenta image) is excellent in stability, thermal resistance and light-fastness can be obtained. Without lowering the concentration when developing, decoloring is not caused when a subsequent color pattern is coated superposed on a pattern that has already been formed. Hence, by using the colored curable composition of the invention, a color filter is excellent in color purity, thermal resistance and light-fastness can be produced.

The pigment monomer represented by formula (I), monomer having one ethylene group, and methods of synthesizing a dye polymer are explained below.

<Pigment Monomer Represented by Formula (I)>

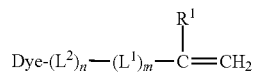

formula (I)

In the formula (I), $R^1$ is a hydrogen atom, a chlorine atom, an alkyl group, or an aryl group. Alkyl group of $R^1$ is substituted or non-substituted straight chain, branched chain or cyclic alkyl group having preferably 1 to 36 carbon atoms, or more preferably 1 to 6 carbon atoms. Examples of alkyl group include a methyl group, an ethyl group, a propyl group, a butyl group, an octyl group, an isopropyl group, and a cyclohexyl group.

Aryl group of $R^1$ is substituted or non-substituted aryl group having preferably 6 to 18 carbon atoms, or more preferably 6 to 12 carbon atoms. Examples of aryl group include phenyl and naphthyl.

Substituent of substituted alkyl group or substituted aryl group of $R^1$ is a halogen atom (for example, fluorine, chlorine, bromine, iodine), an alkyl group (alkyl group preferably having 1 to 24 carbon atoms, more preferably 1 to 12 carbon atoms, for example, methyl, ethyl, propyl, butyl, isopropyl, t-butyl, 2-ethylhexyl, dodecyl, cyclopropyl, cyclopentyl, cyclohexyl, adamantyl), an aryl group (aryl group preferably having 6 to 24 carbon atoms, more preferably 6 to 12 carbon atoms, for example, phenyl, naphthyl), a hetero cyclic group (hetero cyclic group preferably having 1 to 24 carbon atoms, more preferably 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, bentotriazole-1-yl), a silyl group (silyl group preferably having 3 to 24 carbon atoms, more preferably 3 to 12 carbon atoms, for example, trimethyl silyl, triethyl silyl, tributyl silyl, t-butyl dimethyl silyl, t-hexyl dimethyl silyl), a hydroxyl group, a cyano group, a nitro group, an alkoxy group (alkoxy group preferably having 1 to 24 carbon atoms, more preferably 1 to 12 carbon atoms, for example, methoxy, ethoxy, 1-butoxy, 2-butoxy, isopropoxy, t-butoxy, dodecyloxy, cycloalkyloxy group (for example, cyclopentyloxy, cyclohexyloxy)), an aryloxy group (aryloxy group preferably having 6 to 24 carbon atoms, more preferably 6 to 12 carbon atoms, for example, phenoxy, 1-naphthoxy), a hetero cyclic oxy group (hetero cyclic oxy group preferably having 1 to 24 carbon atoms, more preferably 1 to 12 carbon atoms, for example, 1-phenyl tetrazole-5-oxy, 2-tetrahydropyranyloxy), a silyloxy group (silyloxy group preferably having 1 to 24 carbon atoms, more preferably 1 to 12 carbon atoms, for example, trimethyl silyloxy, t-butyl dimethyl silyloxy, diphenyl methyl silyloxy), an acyloxy group (acyloxy group preferably having 2 to 24 carbon atoms, more preferably 2 to 12 carbon atoms, for example, acetoxy, pivaloyloxy, benzoyloxy, dodecanoyloxy), an alkoxy carbonyloxy group (alkoxy carbonyloxy group preferably having 2 to 24 carbon atoms, more preferably 2 to 12 carbon atoms, for example, ethoxy carbonyloxy, t-butoxy carbonyloxy, cycloalkyloxy carbonyloxy group (for example, cyclohexyloxy carbonyloxy), an aryloxy carbonyloxy group (aryloxy carbonyloxy group preferably having 7 to 24 carbon atoms, more preferably 7 to 12 carbon atoms, for example, phenoxy carbonyloxy), a carbamoyloxy group (carbamoyloxy group preferably having 1 to 24 carbon atoms, more preferably 1 to 12 carbon atoms, for example, N,N-dimethyl carbamoyloxy, N-butyl carbamoyloxy, N-phenyl carbamoyloxy, N-ethyl-N-phenyl carbamoyloxy), a sulfamoyloxy group (sulfamoyloxy group preferably having 1 to 24 carbon atoms, more preferably 1 to 12 carbon atoms, for example, N,N-dethylsulfamoyloxy, N-propyl sulfamoyloxy), an alkyl sulfonyloxy group (alkyl sulfonyloxy group preferably having 1 to 24 carbon atoms, more preferably 1 to 12 carbon atoms, for example, methyl sulfonyloxy, hexadecyl sulfonyloxy, cyclohexyl sulfonyloxy), an aryl sulfonyloxy group (aryl sulfonyloxy group preferably having 6 to 24 carbon atoms, more preferably 6 to 12 carbon atoms, for example, phenyl sulfonyloxy), an acyl group (acyl group preferably having 1 to 24 carbon atoms, more preferably 1 to 12 carbon atoms, for example, formyl, acetyl, pivaloyl, benzoyl, tetradecanoyl, cyclohexanoyl), an alkoxy carbonyl group (alkoxy carbonyl group preferably having 2 to 24 carbon atoms, more preferably 2 to 12 carbon atoms, for example, methoxy carbonyl, ethoxy carbonyl, octadecyloxy carbonyl, cyclohexyloxy carbonyl), an aryloxy carbonyl group (aryloxy carbonyl group preferably having 7 to 24 carbon atoms, more preferably 7 to 12 carbon atoms, for example, phenoxy carbonyl), a carbamoyl group (carbamoyl group preferably having 1 to 24 carbon atoms, more preferably 1 to 12 carbon atoms, for example, carbamoyl, N,N-diethyl carbamoyl, N-ethyl-N-octyl carbamoyl, N,N-dibutyl carbamoyl, N-propyl carbamoyl, N-phenyl carbamoyl, N-methyl-N-phenyl carbamoyl, N,N-dicyclohexyl carbamoyl), an amino group (amino group preferably having 24 or less carbon atoms, more preferably 12 or less carbon atoms, for example, amino, methylamino, N,N-dibutylamino, tetradecylamino, 2-ethylhexylamino, cyclohecylamino), an anilino group (anilino group preferably having 6 to 24 carbon atoms, more preferably 6 to 12 carbon atoms, for example, anilino, N-methyl anilino), a hetero cyclic amino group (hetero cyclic amino group preferably having 1 to 24 carbon atoms, more preferably 1 to 12 carbon atoms, for example, 4-pyridylamino), a carvone amido group (carvone amido group preferably having 2 to 24 carbon atoms, more preferably 2 to 12 carbon atoms, for example, acetamide, benzamide, tetradecane amide, pivaloyl amide, cyclohexane amide), an ureido group (ureido group preferably having 1 to 24 carbon atoms, more preferably 1 to 12 carbon atoms, for example, ureide, N,N-dimethyl ureide, N-phenyl ureide), an imido group (imido group preferably having 20 or less carbon atoms, more preferably 12 or less carbon atoms, for example, N-succine imide, N-phthal imide), an alkoxy carbonyl amino group (alkoxy carbonyl amino group preferably having 2 to 24 carbon atoms, more preferably 2 to 12 carbon atoms, for example, methoxy carbonyl amino, ethoxy carbonyl amino, t-butoxy carbonyl amino, octadecyloxy carbonyl amino, cyclohexyloxy carbonyl amino), an aryloxy carbonyl amino group (aryloxy carbonyl amino group preferably having 7 to 24 carbon atoms, more preferably 7 to 12 carbon atoms, for example, phenoxy carbonyl amino), a sulfonamido group (sulfonamido group preferably having 1 to 24 carbon atoms, more preferably 1 to 12 carbon atoms, for example, methane sulfonamide, butane sulfonamide, benzene sulfonamide, hexadecane sulfonamide, cyclohexene sulfonamide), a sulfamoyl amino group (sulfamoyl amino group preferably having 1 to 24 carbon atoms, more preferably 1 to 12 carbon atoms, for example, N,N-dipropyl sulfamoyl amino, N-ethyl-N-dodecyl sulfamoyl amino), an azo group (azo group preferably having 1 to 24 carbon atoms, more preferably 1 to 12 carbon atoms, for example, phenylazo, 3-pyrazolylazo), an alkylthio group (alkylthio group preferably having 1 to 24 carbon atoms, more preferably 1 to 12 carbon atoms, for example, methylthio, ethylthio, octylthio, cyclohexylthio), an arylthio group (arylthio group preferably having 6 to 24 carbon atoms, more preferably 6 to 12 carbon atoms, for example, phenylthio), a hetero cyclic thio group (hetero cyclic thio group preferably having 1 to 24 carbon atoms, more preferably 1 to 12 carbon atoms, for example, 2-benzothiazolylthio, 2-pyridylthio, 1-phenyl tetrazolylthio), an alkyl sulfinyl group (alkyl sulfinyl group preferably having 1 to 24 carbon atoms, more preferably 1 to 12 carbon atoms, for example, dodecane sulfinyl), an aryl sulfinyl group (aryl sulfinyl group preferably having 6 to 24 carbon atoms, more preferably 6 to 12 carbon atoms, for example, phenyl sulfinyl), an alkyl sulfonyl group (alkyl sulfonyl group preferably having 1 to 24 carbon atoms, more preferably 1 to 12 carbon atoms, for example, methyl sulfonyl, ethyl sulfonyl, propyl sulfonyl, butyl sulfonyl, isopropyl sulfonyl, 2-ethylhexyl sulfonyl, hexadecyl sulfonyl, octyl sulfonyl, cyclohexyl sulfonyl), an aryl sulfonyl group (aryl sulfonyl group preferably having 6 to 24 carbon atoms, more preferably 6 to 12 carbon atoms, for example, phenyl sulfonyl, 1-naphthyl sulfonyl), a sulfamoyl group (sulfamoyl group preferably having 24 or less carbon atoms, more preferably 16 or less carbon atoms, for example, sulfamoyl, N,N-dipropyl sulfamoyl, N-ethyl-N-dodecyl sulfamoyl, N-ethyl-N-phenyl sulfamoyl, N-cyclohexyl sulfamoyl), a sulfo group, phosphoyl group (phosphonyl group preferably having 1 to 24 carbon atoms, more preferably 1 to 12 carbon atoms, for example, phenoxy phosphonyl, octyloxy phosphonyl, phenyl phosphonyl), and a phosphinoyl amino group (phosphinoyl amino group preferably having 1 to 24 carbon atoms, more preferably 1 to 12 carbon atoms, for example, diethoxy phosphinoyl amino, dioctyloxy phosphinoyl amino).

If the substituent of substituted alkyl group or substituted aryl group of $R^1$ can be further substituted, it may be substituted by any one the substituents listed above. When substituted by two or more substituents, the substituents may be either same or different.

In formula (I), $L^1$ is $-N(R^2)C(=O)-$, $-OC(=O)-$, $-C(=O)N(R^2)-$, $-C(=O)O-$, or a group represented by formula (II), formula (III), or formula (IV). $R^2$ is a hydrogen atom, an alkyl group, an aryl group, or a hetero cyclic group.

The alkyl group, aryl group, or hetero cyclic group of $R^2$ is same as the alkyl group, aryl group, or hetero cyclic group explained in the substituent of substituted alkyl group or substituted aryl group of $R^1$.

The alkyl group, aryl group, or hetero cyclic group of $R^2$ may be substituted by the substituent explained in $R^1$. When substituted by two or more substituents, the substituents may be either same or different.

Formula (II) to formula (IV) represented by $L^1$ are explained.

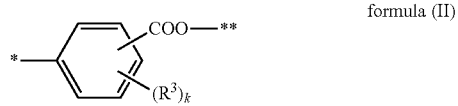

formula (II)

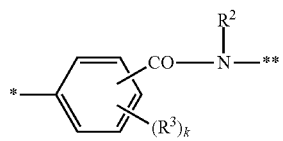

formula (III)

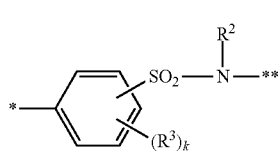

formula (IV)

In formula (II), formula (III), and formula (IV), $R^3$ is a hydrogen or a substituent. The substituent of $R^3$ is synonymous with the substituent explained in the substituted alkyl group and substituted aryl group of $R^1$. k is an integer from 0 to 4.

If the substituent of $R^3$ can be further substituted, it may be substituted by any one the substituents explained in $R^1$. When substituted by two or more substituents, the substituents may be either same or different.

In formula (III) and formula (IV), $R^2$ is same as explained in formula (I). "*" is a coupling position with —C($R^1$)=CH$_2$ group in formula (I). "**" is a coupling position with $L^2$ or Dye (in the case of n=0) in formula (I).

$L^2$ is divalent group for coupling $L^1$ or —C($R^1$)=CH$_2$ group and Dye. $L^2$ is preferably an alkylene group, an aralkylene group, an arylene group, —O—, —C(=O)—, —OC(=O)—, OC (=O)O—, —OSO$_2$—, —OC(=O)N($R^{50}$)—, —N($R^{50}$)—, —N($R^{50}$)C(=O)—, —N($R^{50}$)C(=O)O—, —N ($R^{50}$)C(=O)N($R^{51}$)—, —N($R^{50}$)SO$_2$—, —N($R^{50}$) SO$_2$N($R^{51}$)—, —S—, —S—S—, —SO—, —SO$_2$—, —SO$_2$N ($R^{50}$)—, and —SO$_2$O—. A plurality of divalent groups may be coupled to form a new divalent group.

$R^{50}$ and $R^{51}$ are each independently a hydrogen atom, an alkyl group, an aryl group, or a hetero cyclic group. The alkyl group, aryl group, and hetero cyclic group of $R^{50}$ or $R^{51}$ are synonymous with the alkyl group, the aryl group, and the hetero cyclic group explained in the substituent of $R^1$. The alkyl group, the aryl group, and the hetero cyclic group of $R^{50}$ or $R^{51}$ may be substituted by any one of the substituents explained in the substituent of $R^1$. When substituted by two or more substituents, the substituents may be either same or different.

When the alkylene group, the aralkylene group, and the arylene group of $L^2$ is a group that can be substituted, they may be substituted by any one of the substituents explained in the substituent of $R^1$. When substituted by two or more substituents, the substituents may be either same or different. n is 0 or 1, and m is 0 or 1.

Dye in formula (I) is pigment residue obtained by removing one arbitrary hydrogen atom from a group represented by formula (V).

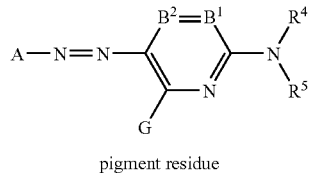

pigment residue

In formula (V), A is aryl, or 5- or 6-memberd aromatic hetero cyclic group.

The aryl group of A is synonymous with the aryl group explained in the substituent of substituted alkyl group and substituted aryl group of $R^1$.

The aromatic hetero cyclic group of A is 5- or 6-memberd aromatic hetero cyclic group having at least one of nitrogen atom, oxygen atom, and sulfur atom. A is preferably any group of pyrrole ring, furan ring, thiophene ring, pyrazole ring, iso-oxazole ring, isothiazole ring, imidazole ring, oxazole ring, thiazole ring, 1,2,4-triazole ring, 1,2,3-triazole ring, pyridine ring, pirimidine ring, pyrazine ring, benzopyrrole ring, benzofuran ring, benzothiophene ring, indazole ring, benzoiso-oxazole ring, benzoisothiazole ring, benzoimidazole ring, benzo-oxazole ring, benzothiazole ring, quinoline ring, isoquinoline ring, 1,2,4-thiadiazole ring, 1,3,4-thiazole ring, and pyrazolotriazole ring.

When these rings are groups that can be substituted, they may have substituents explained in the substituted alkyl group and substituted aryl group of $R^1$. When rings represented by A have two or more substituents, these substituents may be either same or different. Further, a 5- or 6-membered ring may be condensed in the aromatic hetero ring of A.

In formula (V), $B^1$ and $B^2$ are each independently =N— or =C$R^6$—. $R^6$ is a hydrogen atom or a substituent. The substituent of $R^6$ is synonymous with the substituent explained in the substituted alkyl group and substituted aryl group of $R^1$.

When the substituent of $R^6$ is a group that can be further substituted, it may be substituted by any substituent explained in the substituted alkyl group and substituted aryl group of $R^1$. When $R^6$ is substituted by two or more substituents, the substituents may be either same or different.

In formula (V), $R^4$ and $R^5$ are each independently a hydrogen atom, an alkyl group, an aryl group, a hetero cyclic group, an acyl group, an alkoxy carbonyl group, an aryl oxycarbonyl group, a carbamoyl group, an alkyl sulfonyl group, an aryl sulfonyl group, or a sulfamoyl group. A preferred range of them is same as the alkyl group, the aryl group, the hetero cyclic group, the acyl group, the alkoxy carbonyl group, the aryl oxycarbonyl group, the carbamoyl group, the alkyl sulfonyl group, the aryl sulfonyl group, or the sulfamoyl group explained in the substituent of substituted alkyl group and substituted aryl group of $R^1$.

When the alkyl group, aryl group, hetero cyclic group, acyl group, alkoxy carbonyl group, aryl oxycarbonyl group, carbamoyl group, alkyl sulfonyl group, aryl sulfonyl group, or sulfamoyl group of $R^4$ and $R^5$ are groups that can be further substituted, they can be substituted by any substituent explained in the substituent of substituted alkyl group and substituted aryl group of $R^1$. When $R^4$ and $R^5$ are each independently substituted by two or more substituents, the substituents may be either same or different.

In formula (V), G is a hydrogen atom or a substituent. The substituent of G is synonymous with the substituent explained in the substituted alkyl group and substituted aryl group of $R^1$. When the substituent of G is a group that can be further substituted, it can be substituted by any substituent explained in the substituent of substituted alkyl group and substituted aryl group of $R^1$. When G is substituted by two or more substituents, the substituents may be either same or different.

In formula (V), $R^4$ and $R^6$, or $R^4$ and $R^5$ may be coupled to form a 5- to 7-membered ring. Any one of A, G, $R^4$, $R^5$, and $R^6$ is coupled with $-(L^2)_n-(L^1)_m-C(R^1)=CH_2$ in formula (I).

The pigment residue represented by formula (V) is preferably represented by formula (VI).

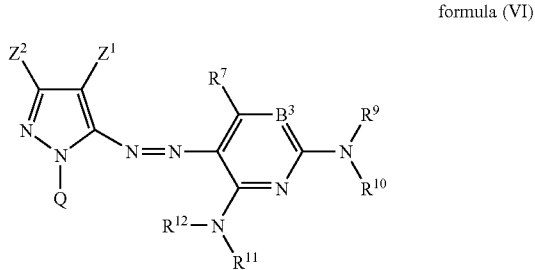

formula (VI)

Formula (VI) is specifically explained.

In formula (VI), $Z^1$ is an electron-attracting group having a Hammett's substituent constant $\sigma_p$ value of 0.20 or more. Hammett is an empirical rule proposed by L. P. Hammett in 1935, and is mentioned in general textbooks. It is specifically described, for example, in "Lange's Handbook of Chemistry" edited by J. A. Dean ($12^{th}$ ed., 1979, McGraw-Hill), or "Domain of Chemistry" extra issue, No. 122, pp. 96-103, 1979 (Nankodo Publishing). In the invention, however, if each substituent is limited or specified by Hammett's substituent constant σp value, substituent represented by $Z^1$ is not limited to substituent only having the known value in the publication cited in the textbooks. When $\sigma_p$ value is measured according to the Hammett's rule, $Z^1$ includes the substituent contained in the range of the $\sigma_p$ value. In the invention, the Hammett's substituent constant $\sigma_p$ value is applied regardless of the position of substitution as a scale expressing the electron effect of substituent, also in other substituents than benzene derivative.

The electron-attracting group having Hammett's $\sigma_p$ value of 0.60 or more includes a cyano group, a nitro group, an alkyl sulfonyl group (straight-chain, branched-chain or cyclic alkyl sulfonyl group preferably having 1 to 12 carbon atoms, more preferably 1 to 8 carbon atoms, for example, methane sulfonyl, ethane sulfonyl, butane sulfonyl, octane sulfonyl, isopropyl sulfonyl, 2-ethylhexyl sulfonyl, cyclopentyl sulfonyl), and an aryl sulfonyl (aryl sulfonyl group preferably having 6 to 18 carbon atoms, more preferably 6 to 12 carbon atoms, for example, benzene sulfonyl, p-toluene sulfonyl).

When the alkyl sulfonyl group, and the aryl sulfonyl group of $Z^1$ are groups that can be further substituted, they can be substituted by any substituent explained in the substituent of substituted alkyl group and substituted aryl group of $R^1$. When the alkyl sulfonyl group, and the aryl sulfonyl group of $Z^1$ are substituted by two or more substituents, the substituents may be either same or different.

The electron-attracting group having Hammett's $\sigma_p$ value of 0.45 or more includes, in addition to the substituents mentioned above, an acyl group (acyl group preferably having 1 to 12 carbon atoms, more preferably 2 to 8 carbon atoms, for example, formyl, acetyl, pivaloyl, cyclohexanoyl, benzoyl), an alkoxy carbonyl group (alkoxy carbonyl group preferably having 2 to 18 carbon atoms, more preferably 2 to 8 carbon atoms, for example, methoxy carbonyl, ethoxy carbonyl, isopropyloxy carbonyl, cyclopentyloxy carbonyl), an aryloxy carbonyl group (aryloxy carbonyl group preferably having 7 to 18 carbon atoms, more preferably 7 to 12 carbon atoms, for example, phenoxy carbonyl, naphthyloxy carbonyl), an alkyl sulfinyl group (alkyl sulfinyl group preferably having 1 to 18 carbon atoms, more preferably 1 to 8 carbon atoms, for example, methyl sulfinyl, ethyl sulfinyl, isopropyl sulfinyl, cyclohexyl sulfinyl), an aryl sulfinyl group (aryl sulfinyl group preferably having 6 to 18 carbon atoms, more preferably 6 to 12 carbon atoms, for example, phenyl sulfinyl, naphthyl sulfinyl), a sulfamoyl group (sulfamoyl group preferably having 0 to 16 carbon atoms, more preferably 0 to 8 carbon atoms, for example, sulfamoyl, N-methyl sulfamoyl, N-ethyl sulfamoyl, N-cyclohexyl sulfamoyl, N-2-ethylhexyl sulfamoyl, N,N-dimethyl sulfamoyl, N-phenyl sulfamoyl, N-ethyl-N-phenyl sulfamoyl), and a halogenated alkyl group (halogenated alkyl group preferably having 1 to 12 carbon atoms, more preferably 1 to 8 carbon atoms, for example, trifluoromethyl).

When the acyl group, the alkoxy carbonyl group, the aryloxy carbonyl group, the alkyl sulfinyl group, the aryl sulfinyl group, the sulfamoyl group, and the halogenated alkyl group of $Z^1$ are groups that can be further substituted, they can be substituted by any substituent explained in the substituent of substituted alkyl group and substituted aryl group of $R^1$. When they are substituted by two or more substituents, the substituents may be either same or different.

The electron-attracting group having Hammett's $\sigma_p$ value of 0.30 or more includes, in addition to the substituents mentioned above, an acyloxy group (acyloxy group preferably having 2 to 18 carbon atoms, more preferably 2 to 8 carbon atoms, for example, acetoxy), a carbamoyl group (carbamoyl group preferably having 1 to 18 carbon atoms, more preferably 1 to 8 carbon atoms, for example, carbamoyl, N-ethyl carbamoyl, N,N-dimethyl carbamoyl, N-phenyl carbamoyl, N-cyclohexyl carbamoyl), a halogenated alkoxy group (halogenated alkoxy group preferably having 1 to 16 carbon atoms, more preferably 1 to 8 carbon atoms, for example, trifluoromethyloxy), a halogenated aryloxy group (halogenated aryloxy group preferably having 6 to 18 carbon atoms, more preferably 6 to 12 carbon atoms, for example, pentafluorophenyl), a halogenated alkylthio group (halogenated alkylthio group preferably having 1 to 18 carbon atoms, more preferably 1 to 8 carbon atoms, for example, difluoromethylthio), an aryl group having two or more substituents of which $\sigma_p$ value is 0.15 or more (aryl group preferably having 6 to 18 carbon atoms, more preferably 6 to 8 carbon atoms, for example, 2,4-dinitrophenyl, pentaflorophenyl), and a hetero ring group (hetero cyclic group preferably having 2 to 18 carbon atoms, more preferably 2 to 8 carbon atoms, for example, 2-benzooxazolyl, 2-benzothiazolyl).

When the acyloxy group, the carbamoyl group, the halogenated alkoxy group, the halogenated aryloxy group, the halogenated alkylthio group, the aryl group having two or more substituents of which $\sigma_p$ value is 0.15 or more, and the hetero ring of $Z^1$ are groups that can be further substituted, they can be substituted by any substituent explained in the substituent of substituted alkyl group and substituted aryl group of $R^1$. When they are substituted by two or more substituents, the substituents may be either same or different.

The electron-attracting group having Hammett's $\sigma_p$ value of 0.20 or more includes, in addition to the substituents mentioned above, a halogen atom and others.

In formula (VI), $Z^2$ is a hydrogen atom or a substituent. The substituent of $Z^2$ is synonymous with the substituent explained in the substituent of substituted alkyl group and substituted aryl group of $R^1$.

When the substituent of $Z^2$ can be substituted further, it may be substituted by any substituent explained in the substituent of substituted alkyl group and substituted aryl group of $R^1$. When $Z^2$ is substituted by two or more substituents, the substituents may be either same or different.

In formula (VI), Q is an alkyl group, an aryl group, or a hetero ring. The alkyl group, aryl group, and hetero ring of Q are same as the alkyl group, the aryl group, and the hetero ring explained in the substituent of substituted alkyl group and substituted aryl group of $R^1$.

When the alkyl group, the aryl group, and the hetero ring of Q can be substituted further, they may be substituted by any substituent explained in the substituent of substituted alkyl group and substituted aryl group of $R^1$. When the alkyl group, the aryl group, and the hetero ring of Q are substituted by two or more substituents, the substituents may be either same or different.

In formula (VI), $R^7$ is a hydrogen atom or a substituent. The substituent of $R^7$ is synonymous with the substituent explained in the substituent of substituted alkyl group and substituted aryl group of $R^1$.

When the substituent of $R^7$ can be substituted further, it may be substituted by any substituent explained in the substituent of substituted alkyl group and substituted aryl group of $R^1$. When the substituent of $R^7$ is substituted by two or more substituents, the substituents may be either same or different.

In formula (VI), $B^3$ is =N—, or —C($R^8$)—. $R^8$ is a hydrogen atom or a substituent. The substituent of $R^8$ is synonymous with the substituent explained in the substituent of substituted alkyl group and substituted aryl group of $R^1$.

When the substituent of $R^8$ can be substituted further, it may be substituted by any substituent explained in the substituent of substituted alkyl group and substituted aryl group of $R^1$. When the substituent of $R^8$ is substituted by two or more substituents, the substituents may be either same or different.

In formula (VI), $R^9$, $R^{10}$, $R^{11}$, and $R^{12}$ are each independently a hydrogen atom, an alkyl group, an aryl group, a hetero cyclic group, an acyl group, an alkoxy carbonyl group, an aryloxy carbonyl group, a carbamoyl group, an alkyl sulfonyl group, an aryl sulfonyl group, or a sulfamoyl group. The alkyl group, the aryl group, the hetero cyclic group, the acyl group, alkoxy carbonyl group, the aryloxy carbonyl group, the carbamoyl group, the alkyl sulfonyl group, the aryl sulfonyl group, or the sulfamoyl group of $R^9$, $R^{10}$, $R^{11}$, and $R^{12}$ are same as the alkyl group, the aryl group, the hetero cyclic group, the acyl group, the alkoxy carbonyl group, the aryloxy carbonyl group, the carbamoyl group, the alkyl sulfonyl group, the aryl sulfonyl group, or the sulfamoyl group explained in the substituent of substituted alkyl group and substituted aryl group of $R^1$.

When the alkyl group, the aryl group, the hetero cyclic group, the acyl group, the alkoxy carbonyl group, the aryloxy carbonyl group, the carbamoyl group, the alkyl sulfonyl group, the aryl sulfonyl group, or the sulfamoyl group of $R^9$, $R^{10}$, $R^{11}$, and $R^{12}$ can be substituted further, they may be substituted by any substituent explained in the substituent of substituted alkyl group and substituted aryl group of $R^1$. When they are substituted by two or more substituents, the substituents may be either same or different.

In formula (VI), $R^7$ and $R^8$, $R^8$ and $R^9$, $R^9$ and $R^{10}$, and $R^{11}$, and $R^{12}$ may be mutually coupled to form a 5- to 7-membered ring. When the mutually coupled 5- to 7-membered ring can be substituted, it may be substituted by any substituent explained in the substituent of substituted alkyl group and substituted aryl group of $R^1$. When 5- to 7-membered ring is substituted by two or more substituents, the substituents may be either same or different.

In formula (VI), any one of $R^7$ to $R^{12}$, $Z^1$, $Z^2$, or Q is coupled with -($L^2$)$_n$-($L^1$)$_m$-C($R^1$)=CH$_2$ in formula (I).

A preferred range of formula (I) is explained.

In formula (I), particularly preferred combinations of substituents are as follows.

(1) $R^1$ is preferably a hydrogen atom, a chlorine atom, and an alkyl group, more preferably a hydrogen atom or an alkyl group, or most preferably a hydrogen atom or a methyl group.

(2) $L^1$ is preferably —N($R^2$)C(=O)—, —OC(=O)—, or a group represented by formula (II), formula (III), or formula (IV). $R^2$ is preferably a hydrogen atom, an alkyl group, or an aryl group. $L^1$ is more preferably —N($R^2$)C(=O)—, or —OC(=O)—, and $R^2$ is more preferably a hydrogen atom, or an alkyl group. m is preferably 1.

(3) $L^2$ is preferably an alkylene group, an aralkylene group, an arylene group, —O—, —OC(=O)—, —OC(=O)O—, —OC(=O)N($R^{50}$)—, —N($R^{50}$)C(=O)—, —N($R^{50}$)SO$_2$—, —S—, —SO$_2$—, or —SO$_2$N($R^{50}$)—. More preferably, it is an alkylene group, an aralkylene group, an arylene group, —O—, —OC(=O)—, OC(=O) O—, —OC(=O)N($R^{50}$)—, —N($R^{50}$)C(=O)—, —N($R^{50}$)C(=O)O—, —N($R^{50}$)SO$_2$—, —S—, —SO$_2$—, or —SO$_2$N($R^{50}$)—. n is preferably 0 or 1.

$R^{50}$ is preferably a hydrogen atom, an alkyl group, or an aryl group, more preferably a hydrogen atom or an alkyl group.

As pigment residue represented by formula (V), particularly preferred combination of substituents are as follows.

(1) $R^4$ and $R^5$ are each independently a hydrogen atom, an alkyl group, an aryl group, a hetero cyclic group, an alkyl sulfonyl group, an aryl sulfonyl group, or an acyl group, more preferably a hydrogen atom, an aryl group, a hetero cyclic group, an alkyl sulfonyl group, or an aryl sulfonyl group, and most preferably a hydrogen atom, an aryl group, or a hetero cyclic group. However, $R^4$ and $R^5$ are not both hydrogen atoms.

(2) G is preferably a hydrogen atom, a halogen atom, an alkyl group, a hydroxyl group, an amino group, or an amido group, more preferably a hydrogen atom, a halogen atom, an amino group, or an amido group, and most preferably a hydrogen atom, an amino group, or an amido group.

(3) A is preferably a pyrazole ring, an imidazole ring, an isothiazole ring, a thiaziazole ring, or a benzothiazole ring, more preferably a pyrazole ring or an isothiazole ring, and most preferably a pyrazole ring.

(4) $B^1$ and $B^2$ are each independently —N=, or —C($R^6$)=, and $R^6$ is preferably a hydrogen atom, a halogen atom, a cyano group, a carbamoyl group, a carboxyl group, an alkyl group, a hydroxyl group, or an alkoxy group, more preferably a hydrogen atom, a cyano group, a carbamoyl group, or an alkyl group.

The pigment residue represented by formula (V) is preferably represented by formula (VI).

Preferred combinations of substituents of pigment residue represented by formula (VI) are explained.

(1) $Z^1$ is preferably a cyano group, an alkoxy carbonyl group, a carbamoyl group, a perfluoroalkyl group, an alkyl sulfonyl group, an aryl sulfonyl group, or a hetero cyclic group, more preferably a cyano group, an alkoxy carbonyl group, a carbamoyl group, or a trifluoromethyl group, and most preferably a cyano group.

(2) $Z^2$ is preferably a hydrogen atom, an alkyl group, an aryl group, an alkoxy group, an aryloxy group, a cyano group, an amido group, an amino group, an alkoxy carbonyl amino group, a carbamoyl amino group, an alkoxy carbonyl group, an alkylthio group, an arylthio group, an alkylsulfonyl group, an aryl sulfonyl group, or a hetero cyclic group, more preferably a hydrogen atom, an alkyl group, an aryl group, an amido group, an amino group, an alkoxy carbonyl group, an alkylthio group, an arylthio group, or a hetero cyclic group, and most preferably a hydrogen atom, an alkyl group, or an aryl group.

(3) Q is preferably an aryl group or a hetero cyclic group, more preferably a hetero cyclic group.

(4) $R^7$ is preferably a hydrogen atom, a halogen atom, an alkyl group, an aryl group, an alkoxy group, a hydroxyl group, an amino group, or an amido group, preferably a hydrogen atom or an alkyl group.

(5) $B^3$ is =N—, or =C($R^8$)—, and $R^8$ is preferably a hydrogen atom, an alkyl group, a cyano group, an alkoxy carbonyl group, or a carbamoyl group, more preferably a hydrogen atom, a cyano group, an alkoxy carbonyl group, or a carbamoyl group, and most preferably a hydrogen atom or a cyano group.

(6) $R^9$, $R^{10}$, $R^{11}$, and $R^{12}$ are preferably, each independently, a hydrogen atom, an alkyl group, an aryl group, a hetero cyclic group, an acyl group, an alkoxy carbonyl group, a carbamoyl group, an alkyl sulfonyl group, or an aryl sulfonyl group, more preferably a hydrogen atom, an alkyl group, an aryl group, or a hetero cyclic group. $R^9$ and $R^{10}$ are not both hydrogen atoms, and $R^{11}$ and $R^{12}$ are not both hydrogen atoms.

Most preferably, $R^9$ is an alkyl group, an aryl group, or a hetero cyclic group, $R^{10}$ is a hydrogen atom, an alkyl group, an aryl group, or a hetero cyclic group, $R^{11}$ is a hydrogen atom, and $R^{12}$ is aan lkyl group or an aryl group.

In preferred combinations of substituents in formula (I), formula (V), and formula (VI), at least one of the substituents is preferably a compound of preferred substituent above. As the number of preferred substituents increases, the compound becomes more preferable. When all substituents are preferred substituents above, the compound is most preferable.

Specific examples of pigment monomers represented by formula (I) are shown below (Exemplary pigment monomers A-1 to A-48, B-1 to B-24, C-1 to C-22). However, the invention is not limited to these examples alone.

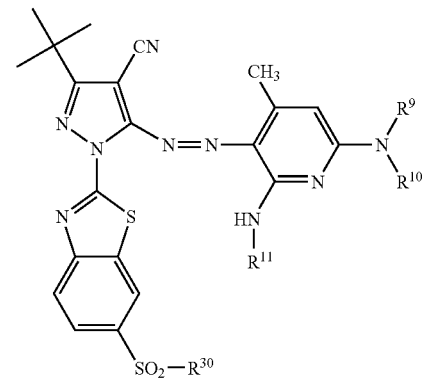

| exemplary pigment monomer | $R^{30}$ | $R^9$ | $R^{10}$ | $R^{11}$ |
|---|---|---|---|---|
| A-1 | —NH—C(CH₃)₂—CH₂O—COCH=CH₂ | 2,4,6-trimethylphenyl | —H | 2,4,6-trimethylphenyl |
| A-2 | —NH—C(CH₃)₂—CH₂O—CO(CH₃)=CH₂ | " | " | " |
| A-3 | —NH—(CH₂)₂OCOCH=CH₂ | " | " | " |
| A-4 | —N(CH₃)—(CH₂)₂OCOCH=CH₂ | " | " | " |
| A-5 | —N(C₂H₅)—(CH₂)₂—OCO—C(CH₃)=CH₂ | " | " | " |

-continued
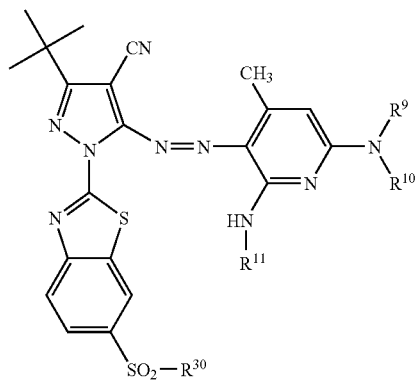
| exemplary pigment monomer | R³⁰ | R⁹ | R¹⁰ | R¹¹ |
|---|---|---|---|---|
| A-6 | —NH—CH(CH₃)—CH₂OCOCH=CH₂ | " | " | " |
| A-7 | —NH—CH(CH₃)—CH₂O—COC(CH₃)=CH₂ | " | " | " |
| A-8 | —NH—(CH₂)₂NHCOCH=CH₂ | " | " | " |
| A-9 | —N(CH₃)—(CH₂)₂NHCOCH=CH₂ | " | " | " |
| A-10 | —NH—C(CH₃)(CH₃)—CH₂O—COCH=CH₂ | " | —CH₃ | " |
| A-11 | " | " | —C₄H₉ | " |
| A-12 | " | " | —CH₂COOC₂H₅ | " |

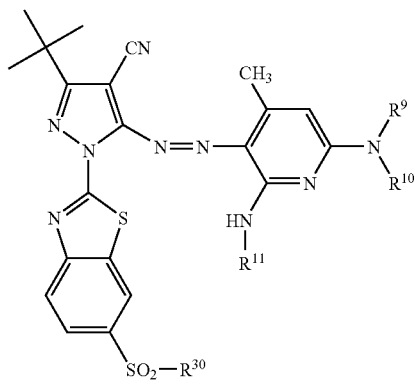

| exemplary pigment monomer | R³⁰ | R⁹ | R¹⁰ | R¹¹ |
|---|---|---|---|---|
| A-13 | —N(CH₃)₂ | 2,4,6-trimethylphenyl (mesityl with CH₃ groups) | —(CH₂)₃OCOCH=CH₂ | 2,4,6-trimethylphenyl (mesityl) |
| A-14 | —NHC₄H₉(t) | " | " | " |
| A-15 | —NHCH(CH₃)CH₂OCH₃ | " | " | " |
| A-16 | —NHCH₂COOH | " | " | " |
| A-17 | —NHCH(CH₃)COOH | " | " | " |
| A-18 | —N(CH₃)—CH₂COOH | " | " | " |
| A-19 | —NH₂ | " | —(CH₂)₃OCOC(CH₃)=CH₂ | " |
| A-20 | —NHCH(CH₃)COOH | " | " | " |
| A-21 | —CH₃ | " | " | " |
| A-22 | —CH(C₂H₅)COOH | " | " | " |
| A-23 | —NH—C(CH₃)₂—CH₂O—COCH=CH₂ | " | 3-methyl-1,2,4-thiadiazol-5-yl | " |
| A-24 | " | " | 2-benzothiazolyl | " |
| A-25 | " | " | —(CH₂)₃COOH | " |

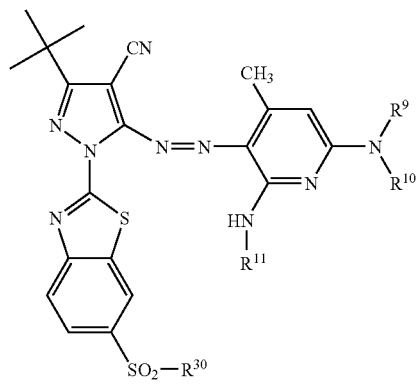

| exemplary pigment monomer | $R^{30}$ | $R^9$ | $R^{10}$ | $R^{11}$ |
|---|---|---|---|---|
| A-26 | —NH—C(CH$_3$)(CH$_3$)—CH$_2$O—COCH=CH$_2$ | 2,4-(CH$_3$)$_2$C$_6$H$_3$— | —H | 2,4-(CH$_3$)$_2$C$_6$H$_3$— |
| A-27 | " | 4-CH$_3$-C$_6$H$_4$— | " | 4-CH$_3$-C$_6$H$_4$— |
| A-28 | " | 2,3-(CH$_3$)$_2$C$_6$H$_3$— | " | 2,3-(CH$_3$)$_2$C$_6$H$_3$— |
| A-29 | " | 2,3-(CH$_3$)$_2$-5-iso-C$_3$H$_7$-C$_6$H$_2$— | —CH$_3$ | 2,3-(CH$_3$)$_2$-5-iso-C$_3$H$_7$-C$_6$H$_2$— |
| A-30 | " | —C$_4$H$_9$ | —H | —C$_4$H$_9$ |
| A-31 | " | —NHC$_4$H$_9$(t) | " | —NHC$_4$H$_9$(t) |
| A-32 | " | —NHCH(CH$_3$)CH$_2$OCH$_3$ | " | —NHCH(CH$_3$)CH$_2$OCH$_3$ |
| A-33 | " | 2,4,5-(CH$_3$)$_3$C$_6$H$_2$— | 3,5-dimethyl-1,2,4-thiadiazol-2-yl | —(CH$_2$)$_3$OCH$_3$ |
| A-34 | " | —(CH$_2$)$_3$OCH$_3$ | " | 2,4,6-(CH$_3$)$_3$C$_6$H$_2$— |

-continued
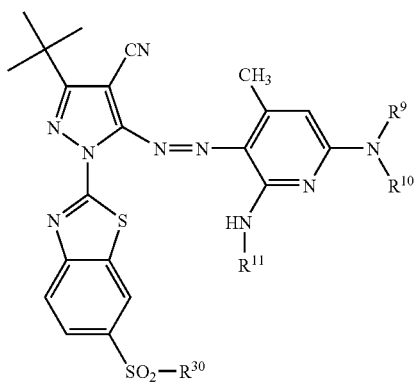
| exemplary pigment monomer | R³⁰ | R⁹ | R¹⁰ | R¹¹ |
|---|---|---|---|---|
| A-35 | " | —(CH₂)₃OCH₃ | —(CH₂)₃OCH₃ | —(CH₂)₃OCH₃ |
| A-36 | " | 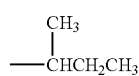 | —H | 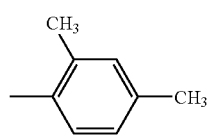 |
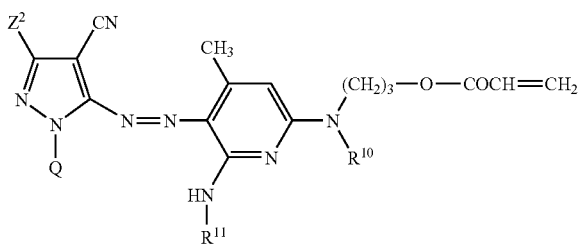
| exemplary pigment monomer | Z² | Q | R¹⁰ | R¹¹ |
|---|---|---|---|---|
| A-37 | —C₄H₉(t) | 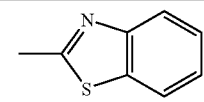 | 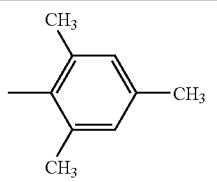 | 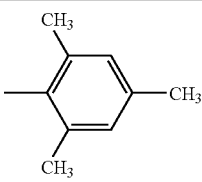 |
| A-38 | —H | " | " | " |
| A-39 | —CH₃ | " | " | " |
| A-40 | —C₄H₉(t) | 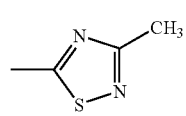 | " | " |
| A-41 | " | 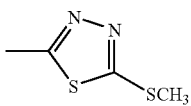 | " | " |

-continued
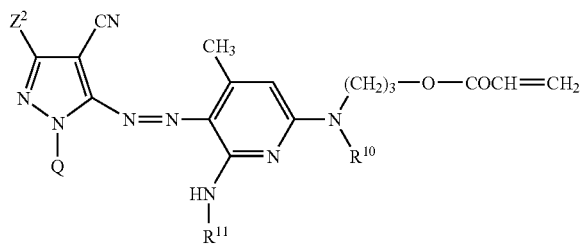
| exemplary pigment monomer | Z² | Q | R¹⁰ | R¹¹ |
|---|---|---|---|---|
| A-42 | 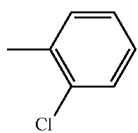 | 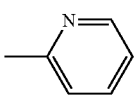 | " | " |
| A-43 | 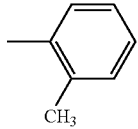 | 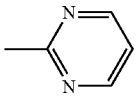 | " | " |
| A-44 | —SO₂CH₃ | 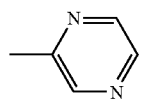 | " | " |
| A-45 | 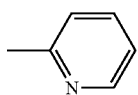 | 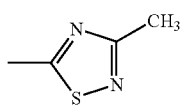 | " | " |
| A-46 | —CF₃ | " | —CH₃ | " |
| A-47 | —CN | —CH₃ | " | " |
| A-48 | 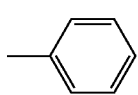 | 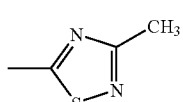 | 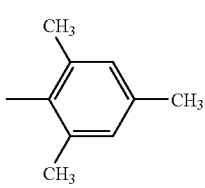 | " |

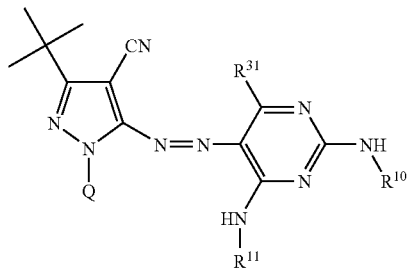
| exemplary pigment monomer | Q | R³¹ |
|---|---|---|
| B-1 | [2-methylbenzothiazol-6-yl]SO₂NH—C(CH₃)₂—CH₂O—COCH=CH₂ | —NH(CH₂)₃OCH₃ |
| B-2 | " | —NHCH₂—CH(C₂H₅)C₄H₉ |
| B-3 | " | —NH—(2,4,6-trimethylphenyl) |
| B-4 | " | —NH—(4-methylphenyl) |
| B-5 | " | —NH(CH₂)₃OCH₃ |
| B-6 | 2-benzothiazolyl | " |
| B-7 | 3-methyl-1,2,4-thiadiazol-5-yl | " |
| B-8 | 5-nitro-2-pyridyl | " |
| B-9 | 2-methyl-6-sulfamoylbenzothiazol-yl | —NH(CH₂)₃OCH₃ |
| B-10 | —(CH₂)₃OCO—C(CH₃)=CH₂ | —NH(CH₂)₃OCH₃ |
| B-11 | 4-CH₃—C₆H₄—NHCO—C(CH₃)=CH₂ | " |
exemplary -continued

| pigment monomer | $R^{10}$ | $R^{11}$ |
|---|---|---|
| B-1 | —(CH$_2$)$_3$OCH$_3$ | —(CH$_2$)$_3$OCH$_3$ |
| B-2 | " | " |
| B-3 | " | " |
| B-4 | " | " |
| B-5 | —CH(CH$_3$)CH$_2$OCH$_3$ | —CH(CH$_3$)CH$_2$OCH$_3$ |
| B-6 | 2-methylbenzothiazol-6-yl-SO$_2$NH$_2$ | —(CH$_2$)$_3$OCOCH=CH$_2$ |
| B-7 | —(CH$_2$)$_3$OCH$_3$ | " |
| B-8 | " | " |
| B-9 | 2,4,6-trimethylphenyl | " |
| B-10 | —CH(CH$_3$)CH$_2$OCH$_3$ | —CH(CH$_3$)CH$_2$OCH$_3$ |
| B-11 | " | " |

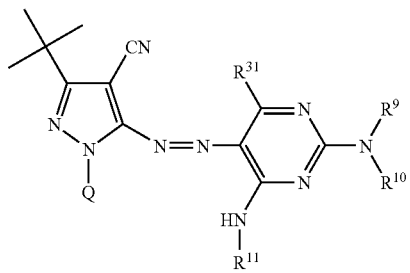

| exemplary pigment monomer | Q | $R^{31}$ | $R^9$ | $R^{10}$ | $R^{11}$ |
|---|---|---|---|---|---|
| B-12 | 2-methylbenzothiazol-yl | —N(CH$_3$)$_2$ | —CH$_3$ | —CH$_3$ | —(CH$_2$)$_3$OCOCH=CH$_2$ |
| B-3 | " | " | " | " | —(CH$_2$)$_3$OCOC(CH$_3$)=CH$_2$ |
| B-14 | 2-methylbenzothiazol-6-yl-COOH | " | " | " | " |

-continued

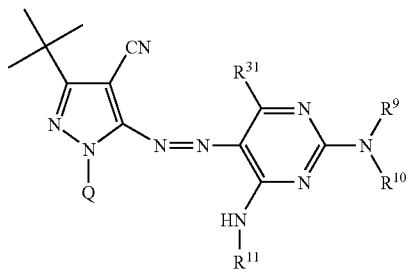

| exemplary pigment monomer | Q | $R^{31}$ | $R^9$ | $R^{10}$ | $R^{11}$ |
|---|---|---|---|---|---|
| B-15 | ![3-methyl-1,2,4-thiadiazol-5-yl] | " | " | " | —(CH$_2$)$_3$OCOCHCH$_2$ |
| B-16 | " | ![N(C2H5)2 on C2H5] C$_2$H$_5$, —N—C$_2$H$_5$ | —C$_2$H$_5$ | —C$_2$H$_5$ | " |
| B-17 | ![4-nitrophenyl] | " | " | " | " |
| B-18 | ![2-(methanesulfonamido)phenyl NHSO2CH3] | " | " | " | " |
| B-19 | ![2-acetamidophenyl NHCOCH3] | ![N(CH3)2] —N(CH$_3$)$_2$ | —CH$_3$ | —CH$_3$ | " |
| B-20 | ![3-methyl-1,2,4-thiadiazol-5-yl] | —NHC$_2$H$_5$ | ![3-methyl-1,2,4-thiadiazol-5-yl] | ![mesityl 2,4,6-trimethylphenyl] | " |
| B-21 | " | —NHSO$_2$CH$_3$ | " | " | " |
| B-22 | " | —Cl | " | " | " |
| B-23 | " | —SC$_4$H$_9$(t) | " | " | " |
| B-24 | " | —OCH$_3$ | " | " | " |

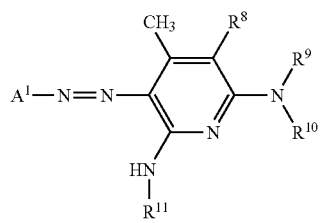

| exemplary pigment monomer | A¹ | R⁸ | R⁹ | R¹⁰ | R¹¹ |
|---|---|---|---|---|---|
| C-1 | 3,5-dimethyl-1,2,4-thiadiazol-yl (H₃C on 3, CH₃ on 5) | —H | —(CH₂)₃OCOCH=CH₂ | 2,4,6-trimethylphenyl | 2,4,6-trimethylphenyl |
| C-2 | " | —CN | " | " | " |
| C-3 | " | —CONH₂ | " | " | " |
| C-4 | " | —COOCH₃ | " | " | " |
| C-5 | 5-methyl-3-phenyl-1,2,4-thiadiazol-yl | —H | " | " | " |
| C-6 | 5-methyl-3-(methylthio)-1,2,4-thiadiazol-yl | " | " | " | " |
| C-7 | 2-benzothiazolyl | " | " | " | " |
| C-8 | 2-methyl-6-sulfamoylbenzothiazolyl | " | " | " | " |
| C-9 | 2-methyl-6-methylsulfonylbenzothiazolyl | " | "" | " | " |
| C-10 | 2-methyl-6-nitrobenzothiazolyl | " | " | " | " |
| C-11 | 3-methyl-2,1-benzisothiazolyl | " | " | —NH(CH₂)₃OCH₃ | —NH(CH₂)₃OCH₃ |

-continued
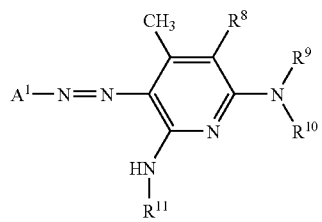
| exemplary pigment monomer | A¹ | R⁸ | R⁹ | R¹⁰ | R¹¹ |
|---|---|---|---|---|---|
| C-12 | 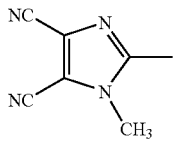 | " | " | " | " |
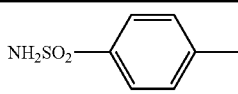
| exemplary pigment monomer | A¹ | R⁸ | R⁹ | R¹⁰ | R¹¹ |
|---|---|---|---|---|---|
| C-13 | 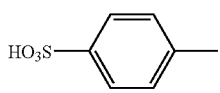 | —H | —(CH₂)₃OCOCH=CH₂ | 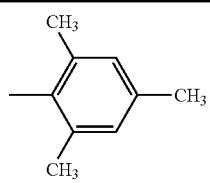 | 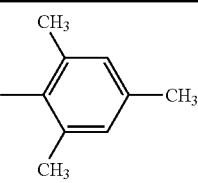 |
| C-14 | 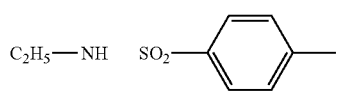 | " | " | " | " |
| C-15 | 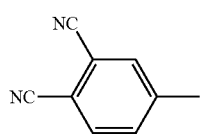 | " | " | " | " |
| C-16 | 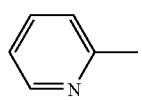 | " | " | " | " |
| C-17 | | " | " | " | " |

-continued

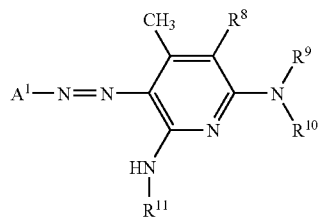

| exemplary pigment monomer | $A^1$ | $R^8$ | $R^9$ | $R^{10}$ | $R^{11}$ |
|---|---|---|---|---|---|
| C-18 | NH$_2$SO$_2$—C$_6$H$_4$— | " | —(CH$_2$)$_3$COOH | " | —(CH$_2$)$_3$OCOCH=CH$_2$ |
| C-19 | H$_3$C-(1,3,4-thiadiazol-2-yl)- | " | " | " | " |
| C-20 | (thiazol-2-yl)- | " | " | " | " |
| C-21 | CH$_2$=CH—C$_6$H$_4$—SO$_2$NH—(3-methylphenyl)— | " | —H | 2,4,6-trimethylphenyl | 2,4,6-trimethylphenyl |
| C-22 | H$_3$C-(1,3,4-thiadiazol-2-yl)- | " | " | " | 2,3,5,6-tetramethyl-4-(NHCOCH=CH$_2$)phenyl |

<Monomer Having One Ethylene Group>

When the dye polymer is prepared by copolymerizing one or more pigment monomer represented by formula (I) and one or more monomer having one ethylene group (called sometimes ethylenic monomer), such ethylenic monomer is explained.

Examples of ethylenic monomer include an acrylic acid, an α-chloracrylic acid, an α-alkylacrylic acid (for example, methacrylic acid), and salts, esters or amides derived from such acrylic acids (for example, sodium acrylate, sodium methacrylate, 2-acrylamide-2-methyl propane sulfonic sodium, 3-acryloyloxy propane sulfonic sodium, acrylamide, methacrylamide, t-butyl acrylamide, diacetone acrylamide, 2-acrylamide-2-methyl propane sulfonic acid, methyl acrylate, methyl methacrylate, ethyl acrylate, n-propyl acrylate, iso-propyl acrylate, butyl acrylate (n-butyl acrylate, t-butyl acrylate), n-butyl methacrylate, 1-ethyl hexyl acrylate, 2-ethyl hexyl acrylate, n-hexyl acrylate, acetoacetoxy ethyl methacrylate, glycidyl methacrylate, 2-hydroxy ethyl acrylate, 2-hydroxy ethyl methacrylate, 3-hydroxy propyl acrylate, 3-hydroxy propyl methacrylate, 2-methane sulfonamide ethyl acrylate, 2-methane sulfonamide ethyl methacrylate, benzyl acrylate), a vinyl esters (for example, vinyl acetate, vinyl propionate, vinyl lauralylate), an acrylonitrile, a methacrylonitrile, an aromatic vinyl compounds (for example, styrene and its derivatives (for example, potassium styrene sulfinate, sodium styrene sulfonate), a vinylidene chloride, a vinyl alkyl ether (for example, vinyl ethyl ether), a maleic esters (for example, methyl maleic ester, ethyl maleic ester), a N-vinyl pyridine and a 2- and 4-vinyl pyridine, and a N-vinyl-2-pyrrolidone. Particularly preferred examples are acrylic acid, methacrylic acid, an acrylic ester, a methacrylic ester, an acrylamide, a methacrylamide, or a styrene.

The proportion of the pigment monomer in the dye polymer of the invention is preferably 20 to 100%, more preferably 50 to 100%, and most preferably 70 to 100%.

Weight-average molecular weight of the dye polymer of the invention is preferably 2000 to 300000, more preferably 3000 to 50000.

<Synthesis of Dye Polymer>

Synthesis of dye polymer of the invention is roughly classified into three processes, (1) solution polymerization process, (2) emulsion polymerization process, and (3) seed polymerization process. Each process produces (i) lipophilic and hydrophilic polymer-pigment, telomer-pigment, (ii) polymer pigment latex, and (iii) layered polymer pigment latex.

The dye polymer of the invention is preferably lipophilic and hydrophilic polymer-pigment, or telomer-pigment obtained from the solution polymerization process.

Specific examples of dye polymers of the invention are shown below (Exemplary dye polymers AP-1 to AP-52, BP-1 to BP-24, CP-1 to CP-19). However, the invention is not limited to these examples alone.

| exemplary pigment multimer | exemplary pigment monomer (mol) | ethylenic monomer 1 (mol) | ethylenic monomer 2 (mol) |
|---|---|---|---|
| AP-1 | A-1 (1) | MAA (1) | none |
| AP-2 | A-1 (1) | MAA (1.5) | none |
| AP-3 | A-1 (1) | MAA (2.0) | none |
| AP-4 | A-1 (1) | MAA (0.5) | none |
| AP-5 | A-1 (1) | none | none |
| AP-6 | A-2 (1) | none | none |
| AP-7 | A-2 (1) | MAA (1) | none |
| AP-8 | A-2 (1) | AA (1) | none |
| AP-9 | A-2 (1) | AA (1.5) | none |
| AP-10 | A-4 (1) | none | none |
| AP-11 | A-4 (1) | MAA (1) | none |
| AP-12 | A-4 (1) | AA (1) | none |
| AP-13 | A-6 (1) | none | none |
| AP-14 | A-6 (1) | MAA (1) | none |
| AP-15 | A-10 (1) | none | none |
| AP-16 | A-10 (1) | MAA (1) | none |
| AP-17 | A-11 (1) | none | none |
| AP-18 | A-11 (1) | MAA (1) | none |
| AP-19 | A-13 (1) | none | none |
| AP-20 | A-13 (1) | MAA (1) | none |
| AP-21 | A-13 (1) | MAA (0.75) | none |
| AP-22 | A-18 (1) | none | none |
| AP-23 | A-18 (1) | MAA (1) | none |
| AP-24 | A-21 (1) | MAA (1) | none |
| AP-25 | A-1 (1) | MAAN (1) | none |
| AP-26 | A-1 (1) | AAN (1) | none |
| AP-27 | A-1 (1) | SSK (1) | none |

MA: methyl acrylate,
EA: ethyl acrylate,
BA: butyl acrylate,
2-EHA: 2-ethyl hexyl acrylate,
MAA: methacrylic acid,
AA: acrylic acid,
DAAM: diacetone acrylamide,
t-BAM: t-butyl acrylamide:
St: styrene,
AAEMA: acetacetoxy ethyl methacrylate,
AAM: acrylamide,
AAN: acrylic acid sodium,
AMPSN: 2-acrylamide-2-methyl propane sulfonic sodium,
APSN: 3-acryloyloxy propane sulfonic sodium,
GMA: glycidyl methacrylate,
MAAN: methacrylic acid sodium,
SSK: styrene sulfinic potassium,
SSN: styrene sulfonic sodium

| exemplary pigment multimer | exemplary pigment monomer (mol) | ethylenic monomer 1 (mol) | ethylenic monomer 2 (mol) |
|---|---|---|---|
| AP-28 | A-1 (1) | APSN (1) | none |
| AP-29 | A-32 (1) | none | none |
| AP-30 | A-32 (1) | MAA (0.8) | none |
| AP-31 | A-32 (1) | MAAN (1) | none |
| AP-32 | A-35 (1) | none | none |
| AP-33 | A-35 (1) | MAA (1) | none |
| AP-34 | A-37 (1) | MAA (1) | none |
| AP-35 | A-38 (1) | MAA (1) | none |
| AP-36 | A-40 (1) | MAA (1) | none |

| exemplary pigment multimer | exemplary pigment monomer (mol) | ethylenic monomer 1 (mol) | ethylenic monomer 2 (mol) |
|---|---|---|---|
| AP-37 | A-41 (1) | MAA (1) | none |
| AP-38 | A-1 (1) | MAA (0.5) | AA (0.5) |
| AP-39 | A-1 (1) | MAA (1) | AA (0.5) |
| AP-40 | A-1 (1) | MAA (1) | AA (1) |
| AP-41 | A-1 (1) | MAA (0.5) | MA (1) |
| AP-42 | A-1 (1) | MAA (1) | BA (1) |
| AP-43 | A-1 (1) | MAA (1) | 2-EHA (0.5) |
| AP-44 | A-4 (1) | MAA (1) | GMA (1) |
| AP-45 | A-4 (1) | MAA (1) | AAEMA (0.5) |
| AP-46 | A-4 (1) | MAA (1) | AAM (1) |
| AP-47 | A-4 (1) | MAA (1) | t-BAM (1) |
| AP-48 | A-4 (1) | AMPSN (0.5) | none |
| AP-49 | A-4 (1) | AMPSN (0.5) | St (0.5) |
| AP-50 | A-4 (1) | SSN (0.5) | none |
| AP-51 | A-4 (1) | APSN (0.5) | none |
| AP-52 | A-4 (1) | MAA (1) | DAAM (1) |

MA: methyl acrylate,
EA: ethyl acrylate,
BA: butyl acrylate,
2-EHA: 2-ethyl hexyl acrylate,
MAA: methacrylic acid,
AA: acrylic acid,
DAAM: diacetone acrylamide,
t-BAM: t-butyl acrylamide:
St: styrene,
AAEMA: acetacetoxy ethyl methacrylate,
AAM: acrylamide,
AAN: acrylic acid sodium,
AMPSN: 2-acrylamide-2-methyl propane sulfonic sodium,
APSN: 3-acryloyloxy propane sulfonic sodium,
GMA: glycidyl methacrylate,
MAAN: methacrylic acid sodium,
SSK: styrene sulfinic potassium,
SSN: styrene sulfonic sodium

| exemplary pigment multimer | exemplary pigment monomer (mol) | ethylenic monomer 1 (mol) | ethylenic monomer 2 (mol) |
|---|---|---|---|
| BP-1 | B-1 (1) | none | none |
| BP-2 | B-1 (1) | MAA (1) | none |
| BP-3 | B-1 (1) | MAA (0.75) | none |
| BP-4 | B-1 (1) | MAA (1) | MA (1) |
| BP-5 | B-7 (1) | none | none |
| BP-6 | B-7 (1) | MAA (1) | none |
| BP-7 | B-7 (1) | AMPSN (1) | none |
| BP-8 | B-7 (1) | AMPSN (0.5) | none |
| BP-9 | B-7 (1) | APSN (0.5) | none |
| BP-10 | B-7 (1) | MAAN (1) | none |
| BP-11 | B-10 (1) | MAA (1) | none |
| BP-12 | B-12 (1) | none | none |
| BP-13 | B-12 (1) | MAA (1) | none |
| BP-14 | B-12 (1) | SSN (0.5) | none |
| BP-15 | B-12 (1) | APSN (0.5) | none |
| BP-16 | B-12 (1) | APSN (1) | none |
| BP-17 | B-15 (1) | none | none |
| BP-18 | B-15 (1) | MAA (1) | none |
| BP-19 | B-15 (1) | MAA (1) | MA (1) |
| BP-20 | B-15 (1) | MAA (1) | AAEMA (0.5) |
| BP-21 | B-15 (1) | MAA (0.5) | 2-EHA (0.5) |
| BP-22 | B-15 (1) | St (0.5) | SSN (0.5) |
| BP-23 | B-15 (1) | APSN (0.5) | EA (1) |
| BP-24 | B-15 (1) | APSN (0.5) | BA (1) |

MA: methyl acrylate,
EA: ethyl acrylate,
BA: butyl acrylate,
2-EHA: 2-ethyl hexyl acrylate,
MAA: methacrylic acid,
AA: acrylic acid,
DAAM: diacetone acrylamide, -continued

| exemplary pigment multimer | exemplary pigment monomer (mol) | ethylenic monomer 1 (mol) | ethylenic monomer 2 (mol) |
|---|---|---|---| t-BAM: t-butyl acrylamide:
St: styrene,
AAEMA: acetacetoxy ethyl methacrylate,
AAM: acrylamide,
AAN: acrylic acid sodium,
AMPSN: 2-acrylamide-2-methyl propane sulfonic sodium,
APSN: 3-acryloyloxy propane sulfonic sodium,
GMA: glycidyl methacrylate,
MAAN: methacrylic acid sodium,
SSK: styrene sulfinic potassium,
SSN: styrene sulfonic sodium

| exemplary pigment multimer | exemplary pigment monomer (mol) | ethylenic monomer 1 (mol) | ethylenic monomer 2 (mol) |
|---|---|---|---|
| CP-1 | C-1 (1) | none | none |
| CP-2 | C-1 (1) | MAA (1) | none |
| CP-3 | C-2 (1) | none | none |
| CP-4 | C-2 (1) | MAA (1) | none |
| CP-5 | C-5 (1) | MAA (1) | none |
| CP-6 | C-6 (1) | MAA (2) | none |
| CP-7 | C-11 (1) | MAA (1) | none |
| CP-8 | C-12 (1) | MAA (1) | none |
| CP-9 | C-1 (1) | MAA (1) | EA (1) |
| CP-10 | C-1 (1) | AMPSN (1) | EA (1) |
| CP-11 | C-1 (1) | AMPSN (0.5) | EA (1) |
| CP-12 | C-1 (1) | APSN (0.5) | none |
| CP-13 | C-1 (1) | APSN (1) | EA (1) |
| CP-14 | C-1 (1) | APSN (1) | BA (0.5) |
| CP-15 | C-1 (1) | APSN (0.5) | BA (1) |
| CP-16 | C-1 (1) | APSN (0.25) | none |
| CP-17 | C-1 (1) | APSN (0.25) | EA (1) |
| CP-18 | C-1 (1) | APSN (0.25) | St (0.5) |
| CP-19 | C-1 (1) | MAA (1) | St (0.5) |

MA: methyl acrylate,
EA: ethyl acrylate,
BA: butyl acrylate,
2-EHA: 2-ethyl hexyl acrylate,
MAA: methacrylic acid,
AA: acrylic acid,
DAAM: diacetone acrylamide,
t-BAM: t-butyl acrylamide:
St: styrene,
AAEMA: acetacetoxy ethyl methacrylate,
AAM: acrylamide,
AAN: acrylic acid sodium,
AMPSN: 2-acrylamide-2-methyl propane sulfonic sodium,
APSN: 3-acryloyloxy propane sulfonic sodium,
GMA: glycidyl methacrylate,
MAAN: methacrylic acid sodium,
SSK: styrene sulfinic potassium,
SSN: styrene sulfonic sodium The dye polymer of the invention may be used in solid state image pick-up elements such as CCD, and color filters for recording and reproducing color images used in display such as LCD and PDP. It may be also used as ink for ink jet or printing.

<<Colored Curable Composition>>

Colored curable composition of the invention includes the above dye polymer, and also contains others as required, such as an alkali-soluble binder, a Cross-linking agent, a monomer, a radiation sensitive compound (examples thereof include photopolymerization initiator, and naphthoquinone diazide compound), and solvents.

When the colored curable compound of the invention is composed in a negative working composition, together with alkali-soluble binder, monomer and photopolymerization initiator can be contained in the composition. When the colored curable compound of the invention is composed in a positive working composition, together with alkali-soluble binder, naphthoquinone diazide compound can be contained in the composition. When the colored curable compound is composed in a positive working composition, as alkali-soluble binder, novolak resin or other phenol resin is preferably used.

<Dye Polymer>

The dye used in the colored curable composition of the invention is one or plural types of dye polymer produced from the pigment monomer represented by formula (I). The dye polymer of the invention may be used as salt such as alkali metal salt (for example, lithium, sodium, potassium, calcium, magnesium), or organic base (for example, triethylamine, trioctylamine, guanidine).

The dye polymer of the invention can be used together with other known pigment. For example, yellow dye includes a pyrazolone azo dye (e.g., see Japanese Patent Application Publication (JP-B) No. 7-111485), a pyridone azo dye (e.g., see JP-A No. 2002-14223), a methine dye (e.g., see JP-A 2001-342364), and a quinophthalone dye. Magenta dye includes a pyrazoloazole azomethine dye, and a xanthene dye (e.g., see JP-A No. 2002-14222). Cyan dye includes a phthalocyanine dye, a triaryl methane dye (e.g., see JP-A No. 2002-14221), a pyrrolozole azomethine dye and the like.

Concentration of dye polymer of the invention in the colored curable composition varies with the molecular weight and molar absorption coefficient, and in total solid content of colored curable composition, the concentration of dye polymer is preferred to be 0.5 to 80% by mass from the viewpoint of film thickness of color filter, spectral absorption, or solubility, more preferably 0.5 to 60% by mass, or most preferably 0.5 to 50% by mass.

<Alkali-Soluble Binder>

The colored curable composition of the invention is preferred to contain at least one of alkali-soluble binder.

The alkali-soluble binder is not particularly specified as far as it is alkali-soluble. The alkali-soluble binder is preferably selected from the viewpoint of heat resistance, developing performance, and availability.

The alkali-soluble binder is preferably a linear organic polymer, soluble in organic solvents, and is able to be developed with a weak aqueous alkali solution. Such linear organic polymers include polymers having carboxylic acids at the side chains. Examples of the polymer having carboxylic acids at the side chains include methacrylic acid copolymers, acrylic acid copolymers, itaconic acid copolymers, crotonic acid copolymers, maleic acid copolymers and partially esterified maleic acid copolymers as described in JP-A Nos. 59-44615, 59-53836 and 59-71048, and Japanese Patent Application Publication (JP-B) Nos. 54-34327, 58-12577 and 54-25957.

Otherwise, acidic cellulose derivatives having carboxylic acids at the side chains are preferable as the alkali-soluble binder.

Other preferable alkali-soluble binders include adducts of acid anhydrides to polymers having hydroxyl groups, polyhydroxystyrene resins, polysiloxane resins, poly(2-hydroxyethyl(meth)acrylate), polyvinyl pyrrolidone, polyethylene oxide and polyvinyl alcohol.

A Hydrophilic monomer may be copolymerized with the alkali-soluble binder. Examples of such monomer include alkoxyalkyl (meth)acrylate, hydroxyalkyl (meth)acrylate, glycerol (meth)acrylate, (meth)acrylamide, N-methylol acrylamide, secondary or tertiary alkyl acrylamide, dialkylaminoalkyl (meth)acrylate, morpholine (meth)acrylate, N-vinyl pyrrolidone, N-vinyl caprolactam, vinyl imidazole, vinyl triazole, methyl (meth)acrylate, ethyl (meth)acrylate, branched or linear propyl (meth)acrylate, branched or linear butyl (meth)acrylate, and phenoxyhydroxypropyl (meth)acrylate.

Other preferable hydrophilic monomers include those containing tetrahydrofurfulyl group, phosphate, phosphate ester, quaternary ammonium salt, ethyleneoxy chain, propyleneoxy chain, sulfonic acid group and salts thereof, and morpholinoethyl groups.

The alkali-soluble binder may have polymerizable groups at the side chain for improving the cross-linking efficiency. Polymers having allyl group, (meth)acrylic or allyloxyalkyl groups at the side chains are also preferable.

Examples of polymer having these polymerizable groups include KS Resist-106 (manufactured by Osaka Chemical Industry Ltd.), and Cyclomer P Series (manufactured by Daicel Chemical Industries, Ltd.).

To increase the strength of the cured film, alcohol soluble nylon, and polyether of 2,2-bis(4-hydroxyphenyl)-propane and epichlorhydrine are also useful.

Among the binders, the alkali-soluble binder that can be used in the invention includes, from the viewpoint of heat resistance, polyhydroxy styrene resin, polysiloxane resin, acrylic resin, acrylamide resin, and acryl/acrylamide copolymer resin. From the viewpoint of control of developing performance, preferred examples include an acrylic resin, an acrylamide resin, and an acryl/acrylamide copolymer resin. Acrylic resin preferably includes copolymer prepared by polymerizing monomer selected from a benzyl (meth)acrylate, a (meth)acryl acid, a hydroxyethyl (meth)acrylate, and a (meth)acrylamide, KS Resist-106 (manufactured by Osaka Chemical Industry Ltd.), and Cyclomer P Series (manufactured by Daicel Chemical Industries, Ltd.).

As the alkali-soluble binder, alkali-soluble phenol resin can be used. The alkali-soluble phenol resin is suitably used when the colored curable composition of the invention is composed as a positive working composition. The alkali-soluble phenol resin includes novolak resin and vinyl polymer.

The novolak resin is produced, for example, by condensing phenols and aldehydes in the presence of acid catalyst. The phenols include a phenol, a cresol, an ethyl phenol, a butyl phenol, a xylenol, a phenyl phenol, a catechol, a resorcinol, a pyrogallol, a naphthol, and a bisphenol A.

Aldehydes include a formaldehyde, a paraformaldehyde, an acetaldehyde, a propionaldehyde, and a benzaldehyde.

The phenols and the aldehydes may be used either alone or in combination of two or more types.

Specific examples of novolak resin include a methacresol, a paracresol, and a condensation product of their mixture and formalin. Molecular weight distribution of novolak resin may be adjusted by sorting or other means. The novolak resin may also contain low molecular weight component having a phenolic hydroxy group such as a bisphenol C or a bisphenol A.

The alkali-soluble binder is preferably polymers having a weight-average molecular weight (polystyrene-equivalent value measured by GPC method) of 1000 to $2 \times 10^5$, more preferably polymer having a weight-average molecular weight of 2000 to $1 \times 10^5$, and particularly polymer having a weight-average molecular weight of 5000 to $5 \times 10^4$.

The content of the alkali-soluble binder in the colored curable composition is, from the viewpoint of coating property, development ability, film thickness of color filter, and dissolving property, preferably 0.5 to 90% by mass relative to the total solid content of the composition.

<Cross-Linking Agent>

Cross-linking agent is explained.

The colored curable composition of the invention provides a film superior in curing property to conventional composition, by using the dye polymer obtained from the pigment monomer represented by formula (I), and a film further advanced in curing can be obtained by using supplementarily a cross-linking agent.

The cross-linking agent available in the invention is not particularly restricted, so long as it is able to cure the layer with the cross-linking agent, and examples of the cross-linking agent include (a) epoxy resins, (b) melamine compounds, guanamine compounds, glycoluryl compounds or urea compounds substituted with at least one substituent selected from methylol group, alkoxymethyl group and acyloxymethyl group, and (c) phenol compounds, naphthol compounds or hydroxyanthrathene compounds substituted with at least one substituent selected from methylol group, alkoxymethyl group and acyloxymethyl group. A multifunctional epoxy resins are particularly preferable.

Any resins may be used as the epoxy resin in the (a) so long as the resin comprises epoxy groups and has a cross-linking property. Examples of the epoxy resin include glycidyl group-containing divalent low molecular weight compounds such as bisphenol A diglycidyl ether, ethyleneglycol diglycidyl ether, butanediol diglycidyl ether, hexanediol diglycidyl ether, dihydroxybiphenyl diglycidyl ether, diglycidyl phthalate and N,N-glycidylaniline; glycidyl group-containing trivalent low molecular weight compounds represented by trivalent trimethylolpropane triglycidyl ether, trimethylolphenol triglycidyl ether and tris P-PA triglycidyl ether; glycidyl group-containing tetravalent low molecular weight compounds represented by pentaerythritol tetraglycidyl ether and tetramethylol bisphenol A tetraglycidyl ether; glycidyl group-containing polyvalent low molecular weight compounds such as dipentaerythritol pentaglycidyl ether and dipentaerythritol hexaglycidyl ether; and glycidyl group-containing high molecular weight compounds represented by polyglycidyl (meth)acrylate and 1,2-epoxy-4-(2-oxylanyl) cyclohexane adduct of 2,2-bis(hydroxymethyl)-1-butanol.

The numbers of the methylol groups, alkoxymethyl groups and acyloxymethyl groups substituting the melamine compounds in the (b) above are preferably 2 to 6, and the numbers of the groups above substituting the glycoluryl compounds, guanamine compounds and urea compounds, respectively, are preferably 2 to 4. More preferably, the numbers of the groups substituting the melamine compounds are 5 to 6, and the numbers of the groups substituting the glycoluryl compounds, guanamine compounds and urea compounds, respectively, are 3 to 4.

The melamine compounds, guanamine compounds, glycoluryl compounds and urea compounds are collectively named as the compounds according to (b) (methylol group-containing compounds, alkoxymethyl group-containing compounds or acyloxymethyl group-containing compounds) hereinafter.

The methylol group-containing compounds according to (b) can be obtained by heating the alkoxymethyl group-containing compounds according to (b) in an alcohol in the presence of an acid catalyst such as hydrochloric acid, sulfuric acid, nitric acid and methanesulfonic acid. The acyloxymethyl group-containing compounds according to (b) can be obtained by mixing acyl chloride with the methylol group-containing compounds according to (b) in the presence of a base catalyst.

Specific examples of the compounds according to (b) having the substituents above will be listed below.

Examples of the melamine compound include hexamethylol melamine, hexamethoxymethyl melamine and compounds having 1 to 5 methylol groups of hexamethylol melamine substituted with methoxymethyl groups, or a mixture thereof; and hexamethoxyethyl melamine, hexaacyloxymethyl melamine and compounds having 1 to 5 methylol groups of hexamethylol melamine substituted with acyloxymethyl groups, or a mixture thereof.

Examples of the guanamine compound include tetramethylol guanamine, tetramethoxymethyl guanamine and compounds having 1 to 3 methylol groups of tetramethylol guanamine substituted with methoxymethyl groups, or a mixture thereof; and tetramethoxyethyl guanamine, tetraacyloxymethyl guanamine and compounds having 1 to 3 methylol groups of tetramethylol guanamine substituted with acyloxymethyl groups, or a mixture thereof.

Examples of the glycoluryl compound include tetramethylol glycoluryl, tetramethoxymethyl glycoluryl and compounds having 1 to 3 methylol groups of tetramethylol glycoluryl substituted with methoxymethyl groups, or a mixture thereof; and compounds having 1 to 3 acyloxymethyl groups of tetramethylol glycoluryl substituted with acyloxymethyl groups, or a mixture thereof.

Examples of the urea compound include tetramethylol urea, tetramethoxymethyl urea and compounds having 1 to 3 methylol groups of tetramethylol urea substituted with methoxymethyl groups, or a mixture thereof; and tetramethoxyethyl urea.

The compounds according to (b) may be used alone, or as a combination thereof.

The compounds in the (c), that is, phenol compounds, naphthol compounds or hydroxyanthracene compounds substituted with at least one group selected from the methylol group, alkoxymethyl group and acyloxymethyl group can suppress inter-mixing of the curable resin composition with a overcoat photoresist by forming cross-links by heating as the case of the compounds in the (b), and the strength of the layer is enhanced. These compounds are collectively named as the compounds according to the (c) (methylol group-containing compounds, alkoxymethyl group-containing compounds or acyloxymethyl group-containing compounds).

At least two methylol groups, acyloxymethyl groups or alkoxymethyl groups should be contained per one molecule of the cross-linking agent in the (c). Compounds in which both the 2-position and 4-position of the phenol compound as a frame compound are substituted are preferable from the viewpoint of cross-linking ability by heating and preservation stability. Compounds in which both the ortho-position and para-position relative to the OH group of the naphthol compound or hydroxyanthracene compound as a frame compound are substituted are also preferable. The 3-position or 5-position of the phenol compound may be either substituted or unsubstituted.

Positions except the ortho-position relative to the OH group may be either substituted or unsubstituted in the naphthol compound.

The methylol group-containing compound according to the (c) may be obtained using a compound having a hydrogen atom at the ortho- or para-position (2- or 4-position) relative to the phenolic OH group as a starting material, and by allowing the material to react with formalin in the presence of a base catalyst such as sodium hydroxide, potassium hydroxide, ammonia or tetraalkylammonium hydroxide.

The alkoxymethyl group-containing compound according to the (c) may be obtained by heating the methylol group-containing compound according to the (c) in an alcohol in the presence of an acid catalyst such as hydrochloric acid, sulfuric acid, nitric acid or methanesulfonic acid.

The acyloxymethyl group-containing compound according to the (c) may be obtained by allowing the methylol group-containing compound according to the (c) to react with an acyl chloride in the presence of a base catalyst.

Examples of the frame compound of the cross-linking agent (c) include phenol, naphthol and hydroxyanthracene compounds in which the ortho- or para-position relative to the phenolic OH group is unsubstituted. Examples of the frame compound available include phenol, isomers of cresol, 2,3-xylenol, 2,5-xylenol, 3,4-xylenol, 3,5-xylenol, bisphenols such as bisphenol A, 4,4'-bishydroxybiohenyl, Tris P-PA (manufactured by Honshu Chemical Industry Co., Ltd.), naphthol, dihydroxynaphthalene and 2,7-dihydroxyanthracene.

Specific examples of the phenol compound or naphthol compound as the cross-linking agent (c) include trimethylolphneol, tri(methoxymethyl)phenol, and compounds having 1 to 2 methylol groups of trimethylol phenol substituted with methoxymethyl groups; trimethylol-3-cresol, tri(methoxymethyl)-3-cresol and compounds having 1 to 2 methylol groups of trimethylol-3-cresol substituted with methoxymethyl groups; dimethylcresol such as 2,6-dimethylol-4-cresol, tetramethylol bisphenol A, tetramethoxymethyl bisphenol A and compounds having 1 to 3 methylol groups of tetramethylol bisphenol A substituted with methoxymethyl groups; tetramethylol-4,4'-bishydroxybiphenyl, tetramethoxymethyl-4,4'-bishydroxybiphenyl, hexamethylol compounds of Tris P-PA, hexamethoxymethyl compounds of Tris P-PA, and compounds having 1 to 5 methylol groups of hexamethylol compound of Tris P-PA substituted with methoxymethyl groups; and bishydroxymethyl naphtalnediol.

Examples of the hydroxyanthracene compound include 1,6-dihydroxymethyl-2,7-dihydroxyanthracene.

Examples of the acyloxymethyl group-containing compound include methylol group-containing compounds in which a part or all the methylol groups are substituted with acyloxymethyl groups.

Preferable compounds among the compounds above include trimethylol phenol, bis hydroxymethyl-p-cresol, tetramethylol bisphenol A, and hexamethylol compounds of Tris P-PA (manufactured by Honshu Chemical Industry Co., Ltd.), or phenol compounds in which the methylol groups are substituted with the alkoxymethyl groups, and in which the methylol groups are substituted with both methylol groups and alkoxymethyl groups.

The compounds according to the (c) may be used alone, or as a combination thereof.

The cross-linking agent is not always contained in the curable composition according to the invention. The total content of the cross-linking agent, if any, according to (a) to (c) in the colored curable composition is, from the viewpoint of curing property, film thickness of color filter, and dissolving property, preferably 1 to 70% by mass, more preferably 5 to 50% by mass, and particularly 7 to 30% by mass, relative to the solid content (mass) of the curable composition, although the content differs depending on the materials used.

<Monomer>

When the colored curable compound of the invention is composed in a negative working composition, a monomer contained in the negative working composition is explained.

The monomer can be contained together with photopolymerization initiator described later, even when the colored curable composition of the invention is composed in positive working composition containing a naphthoquinone diazide compound described below. In this case, the monomer can promote the curing degree of formed pattern. The monomer is described below.

The monomer is preferably a compound comprising ethylenic unsaturated groups containing at least one ethylene group capable of addition polymerization and a boiling point of 100° C. or more at normal pressures. Examples of the monomer include monofunctional acrylate and methacrylate such as polyethyleneglycol mono(meth)acrylate, polypropyleneglycol mono(meth)acrylate, phenoxyethyl (meth)acrylate; (meth)acrylate compounds prepared after an addition reaction of ethylene oxide or propylene oxide to polyfunctional alcohols such as polyethyleneglycol di(meth)acrylate, trimethylolethane tri(meth)acrylate, neopentylglycol di(meth)acrylate, pentaerythritol tri(meth)acrylate, pentaerytbritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanulate, glycerine and trimethylolethane; urethane acrylates described in JP-B Nos. 48-41708 and 50-6034, and JP-A No. 51-37193; polyester acrylates described in JP-A No. 48-64183 and JP-B No. 49-43191 and 52-30490; polyfunctional acrylate and methacrylate of epoxyacrylate as a reaction product of an epoxy resin and (meth)acrylic acid; and mixtures thereof.

Further, examples of the monomer include the compounds described in Nihon Secchaku Kyokai-shi Vol. 20, No. 7, pp. 300-308 as a photo-curable monomer and an oligomer are also included in the compounds of the invention.

The content of monomer in the colored curable composition is, from the viewpoint of curing property and film thickness of color filter, preferred to be 0.1 to 90% by mass of the solid content, more preferably 1.0 to 80% by mass, and most preferably 2.0 to 70% by mass.

<Radiation-Sensitive Compound>

The colored curable composition of the invention comprises at least one kind selected from the radiation-sensitive compounds. The radiation-sensitive compound is able to effect chemical reactions such as generation of radicals, acids and bases by irradiation of radiation such as UV, deep UV, visible light, infrared light and electron beam. The radiation-sensitive compound is used for making the alkali-soluble binder insoluble by cross-linking, polymerization and decomposition of acidic groups, or for making coating layers insoluble to an alkali developer by inducing polymerization of the polymerizable monomer and oligomer remaining in the coating layer or cross-linking of the cross-linking agent.

In particular, when the colored curable composition is composed in negative working composition, it is suitable to contain a photopolymerization initiator. When the colored curable composition is composed in positive working composition, it is preferred to contain a naphthoquinone diazide compound.

(Photopolymerization Initiator)

A photopolymerization initiator to be contained when the colored curable composition of the invention is a negative working composition is explained.

The photopolymerization initiator is not particularly restricted so long as it is able to polymerize the monomer having a polymerizable group. The photopolymerization initiator is preferably selected from the viewpoint of its properties, polymerization initiation efficiency, absorbing wavelength, availability and cost. The photopolymerization initiator may be added to the positive working colored curable composition comprising the o-quinone diazide compound, in the case of hardness of the pattern formed is enhanced.

Examples of the photopolymerization initiator include at least one of active halogen compounds selected from halomethyloxadiazole compounds and halomethyl-s-triazine compounds, 3-aryl-substituted coumalin compounds, lophine dimmers, benzophenone compounds, acetophenone compounds and their derivatives, and cyclopentadiene-benzene-iron complex and salt thereof, and an oxime-based compound.

Examples of the active halogen compound as the halomethyl oxadiazole compound include 2-halomethyl-5-vinyl-1,3,4-oxadiazole compounds described in JP-B No. 57-6096, 2-trichloromethyl-5-styryl-1,3,4-oxadiazole, 2-trichloromethyl-5-(p-cyanostyryl)-1,3,4-oxadiazole, and 2-trichloromethyl-5-(p-methoxystyryl)-1,3,4-oxadiazole.

Examples of the halomethyl-s-triazine compound include vinyl-halomethyl-s-triazine compounds described in JP-B No. 59-1281, 2-(naphto-1-yl)-4,6-bis-halomethyl-s-triazine compounds described in JP-A No. 53-133428, and 4-(p-aminophenyl)-2,6-di-halomethyl-s-triazine compounds.

Other specific examples include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphto-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromehtyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenly]-2,6-di(trichloromethyl)-s-triazine, 4-[o-methyl-p-N,N-di(ethoxycarbonylmethyl)aminophenyl]2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloroethyl)-s-triazine, 4-(p-N-chloroethylaminophenly)-2,6-di(trichloromethyl)-s-triazine, 4-(p-N-ethoxycarbonylmethylaminophenol)-2,6-di(trichloromethyl)-s-triazine, 4-[p-N,N-di(phenyl)aminophenyl]-2,6-di(trichloromethyl)-s-triazine, 4-(p-N-chloroethylcarbonylaminophenyl)-2,6-di(trichloromethyl)-s-triazine, 4-[p-N-(p-mehtoxyphenyl)carnonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di (ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminohenyl]-2,6-di(trichloromethyl)-s-triazine, 4-[m-bromo-p-N,N-di(chloroethyl)aminohenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethyl-aminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylwninophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, and 4-(o-fluoro-p-N-chloroethylaminophenyl)-2,6-di(trichloromethyl)-s-triazine.

Other preferable examples include TAZ-series manufactured by Midori Kagaku Co., Ltd. (for example, trade name: TAZ-107, TAZ-110, TAZ-104, TAZ-109, TAZ-140, TAZ-204, TAZ-113 and TAZ-123), T series manufactured by PAN-CHIM, Ltd. (for example, trade namne: T-OMS, T-BMP, T-R, and T-B), IRGACURE series manufactured by Ciba Specialty Chemicals (for emample, trade name: IRGACURE 369, IRGACURE 784, IRGACURE 651, IRGACURE 184, IRGACURE 500, IRGACURE 1000, IRGACURE 149, IRGACURE 819, IRGACURE 261, and DAROCUR series (for example DAROCUR 1173), and 4,4'-bis(diethylamino)-benzophenone, 2-(O-benzoyloxime)-1-[4-(phenylthio)phenyl]-1,2-octandione, 2-benzyl-2-dimethylamino-4-morpholinobutyrophenone, 2,2-dimethoxy-2-phenylacetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoin isopropyl ether.

Known Photopolymerization initiators other than those described above may be used together with the colored curable composition of the invention. Examples of them include vicinal polyketolaldonyl compounds described in U.S. Pat. No. 2,367,660, α-carbonyl compounds described in U.S. Pat. Nos. 2,367,661 and 2,367,670, acyloin ether compounds described in U.S. Pat. No. 2,448,828, aromatic acyloin compounds substituted with α-carbohydrates described in U.S. Pat. No. 2,722,512, polynuclear quinone compounds described in U.S. Pat. Nos. 3,046,127 and 2,951,758, combinations of trially imidazole dimer and p-aminophenyl ketone described in U.S. Pat. No. 3,549,367, and bemzothiazole compounds/trihalomethyl-s-triazine compounds described in JP-B No. 51-48516.

The content of the photopolymerization initiator in the colored curable composition is preferably 0.01 to 50% by mass, more preferably 1 to 30% by mass, and particularly preferably 1 to 20% by mass based on the solid content of a monomer (mass). In a case where the content is within the range described above, the polymerization proceeds and the film strength can be ensured.

Sensitizers and light stabilizers may be used together with these photopolymerization initiators. Specific examples of them include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraqunone, 2-ethyl-9,10-anthraquinone, 2-t-butyl-9,10-anthraquinone, 2,6-dichloro-9,10-anthraquinone, xanthone, 2-methylxanthone, 2-ethoxyxanthone, thioxanthone, 2,4-diethylthioxanthone, acrydone, 10-butyl-2-chloroacrydone, benzyl, banzalacetone, p-(dimethylamino)phenylstyrylketone, p-(dimethylamino) phanyl-p-methylstyrrylketone, dibenzophenone, p-(dtmethylamino) benzophenone (or Michler's ketone), p-(diethylamino)benzophenone, benzoanthrone, and benzothiazole compounds described in JP-B No. 51-48516, Tinuvin 1130 and Tinuvin 400.

In the colored curable composition of the invention, a heat polymerization inhibitor is preferably added on addition to the additives above. Examples of the heat polymerization inhibitor preferably include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobenzimidazole.

(Naphthoquinone Diazide Compound)

To obtain positive type image, that is, when the colored curable composition of the invention is composed in a positive working composition, it is preferred to contain a naphthoquinone diazide compound in the colored curable composition of the invention.

The naphthoquinone diazide compound includes, for example, o-naphthoquinone diazide-5-sulfonic esters, o-naphthoquinone diazide-5-sulfonic amides, o-naphthoquinone diazide-4-sulfonic esters, and o-naphthoquinone diazide-4-sulfonic amides. These ester compounds and amide compounds can be produced by known method by using a phenol compound shown in formula (I) in JP-A No. 2-84650, and JP-A No. 3-49437.

<Solvent>

The colored curable composition of the invention usually requires a solvent (simply referred to a solvent in the specification) for preparation. The solvent is not particularly restricted provided that it satisfies solubility of each component and coating ability of the colored curable composition. The solvent is preferably selected considering solubility of the dye and alkali-soluble binder, coating ability and safety.

Examples of the preferable solvent include esters such as ethyl acetate, n-butyl acetate, isobutyl acetate, amyl fornate, isoamyl acetate, butyl propionate, isopropyl butylate, ethyl butylate, butyl butylate, alkyl esters, methyl lactate, ethyl lactate, methyl oxylactate, ethyl oxylactate, butyl oxylactate, methyl methoxyacetate, ethyl methoxyacetate, butyl methoxyacetate, methyl ethoxyacetate, ethyl ethoxyacetate; 3-oxypropionic acid alkyl esters such as methyl 3-oxypropionate and ethyl 3-oxypropionate including methyl 3-methoxypropionate, ethyl 3-methoxypropionate, methyl 3-ethoxypropionate and ethyl 3-ethoxypropionate; 2-oxypropionic acid alkyl esters such as methyl 2-oxypropionate, ethyl 2-oxypropionate and propyl 2-oxypropionate including methyl 2-methoxypropyonate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, and ethyl 2-ethoxy-2-methylpropionate; methyl pyruvate, ethyl pyruvate, propyl pyruvate, methyl acetoacetate, ethyl acetoacetate, methyl 2-oxobutanate and ethyl 2-oxobutanate;

ethers such as diethyleneglycol dimethylether, tetrahydroftiran, ethyleneglycol monomethylether, ethyleneglycol monoethylether, methyl cellosolve acetate, ethyl cellosolve acetate, diethyleneglycol monomethylether, diethyleneglycol monoethylether, diethyleneglycol monobutylether, propyleneglycol methyl ether, propyleneglycol methylether acetate, propyleneglycol ethylether acetate, and propyleneglycol propylether acetate;

ketones such as methylethyl ketone, cyclohexanone, 2-heptanone and 3-heptanone; and aromatic hydrocarbons such as toluene and xylene.

Methyl 3-ethoxypropionate, ethyl 3-ethoxypropionate, ethyl cellosolve acetate, ethyl lactate, diethyleneglycol dimethylether, butyl acetate, methyl 3-methoxypropionate, 2-heptanone, cyclohexanone, cyclopentanone, ethylcarbitol acetate, butylcarbitol acetate, propyleneglycol methylether and propyleneglycol methylether acetate are more preferable among them.

<Additives>

Various additives such as fillers, polymer compounds other than those above, surfactants, adherence enhancing agents, antioxidants, ultraviolet absorbing agents and antiflocculants may be added, if necessary, to the colored curable composition of the invention.

Specific examples of the additives include fillers such as glass and alumina; polymer compounds other than the binding resins such as polyvinyl alcohol, polyacrylic acid, polyethyleneglycol monoalkylether and polyfluoroalkyl acrylate; surfactants such as nonionic, cationic and anionic surfactants; adherence enhancing agents such as vinyl trimethoxy silane, vinyl triethoxy silane, vinyl tris(2-methoxyethoxy)silane, N-(2-aminoethyl)-3-aminopropylmethylmetoxy silane, N-(2-aminoethyl)-3-aminopropyltrimethoxy silane, 3-aminopropyltriethoxy silane, 3-glycidoxypropyl trimethoxy silane, 3-glycidoxypropyl methyldimethoxy silane, 2-(3,4-epoxycyclohexyl)ethyl trimethoxy silane, 3-chloropropylmethyl dimethoxy silane, 3-chloropropyl trimethoxy silane, 3-methacryloxypropyl trimethoxy silane, and 3-mercaptopropyl trimethoxy silane; antioxidants such as 2,2-thiobis(4-methyl-6-t-butylphenol) and 2,6-di-t-butylphenol; ultraviolet absorbing agents such as 2-(3-t-butyl-5-methyl-2-hydroxydiphenyl)-5-chlorobenzotriazole and alkoxybenzophenone; and antiflocculants such as sodium polyacrylate.

Organic carboxylic acids, preferably low molecular weight organic carboxylic acids with a molecular weight of 1000 or less may be added for enhancing alkali solubility of non-cured parts to further improving development ability of the colored curable composition of the invention.

Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimetylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acid such as benzoic acid, toluic acid, cuminic acid, hemelitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydroatropic acid, hydrocinnamic acid, mandelic acid, phenylsuccinic acid, atropic acid, cinnamic acid, methyl cinnamate, benzyl cinnamate, cinnamilydenic acid, cumalic acid and umbelic acid.

When the colored curable composition of the invention is a positive working composition, from the viewpoint of curing property and dissolving property, the alkali-soluble phenol resin and cross-linking agent are preferred to be dissolved in the organic solvent usually at a rate of 2 to 50% by mass and 2 to 30% by mass, respectively.

The content of the naphthoquinone diazide compound and the organic solvent is, from the viewpoint of curing property and dissolving property, usually 2 to 30% by mass and 2 to 50% by mass relative to mass of the solution dissolving the alkali-soluble resin and cross-linking agent, respectively.

The colored curable composition of the invention may be suitably used for forming colored pixels such as color filters used for liquid crystal displays (LCD) and solid state image pick-up elements (for example CCD and CMOS), and for preparing printing inks, ink-jet inks and paints.

<<Color Filter and Method of Producing Thereof>>

The color filter of the invention is produced by using the colored curable composition of the invention. The color filter of the invention can be produced by forming a colored pattern (resist pattern) by applying the colored curable composition onto a support by various coating methods including rotary coating, salivation coating or roll coating to form a radiation sensitive compound, exposing through a specified mask pattern, and developing by developing solution. The method of producing color filter of the invention may also, as required, include a process of curing the resist pattern by heating and/or exposing.

When the colored curable composition is composed in a positive working composition, the method may also include a process of forming a colored pattern by post baking after forming the image.

When the colored curable composition of the invention is constructed as a negative working composition, a negative-type color filter may be prepared by repeating the plural times of the image forming process (and curing step, if necessary) corresponding to the number of the hues. When the colored curable composition of the invention is constructed as a positive working composition, the positive-type color filter may be prepared by repeating the plural times of the image forming process and post-baking process corresponding to the number of the hues.

The colored curable composition of the invention is free from lowering of density (decoloring) of first color pattern when second color pattern is formed by applying, exposing and developing after forming first color pattern, and free from color mixing, that is, excellent in so-called process color mixing by mixing pigment of second color into the image of first color.

Examples of the support include a soda glass, Pyrex (R) glass and quartz glass, which are used for a liquid crystal displays those on which a transparent conductive film is adhered, and the substrate of photoelectric conversion elements used for the imaging element such as, for example, a silicone substrate and complementary metal oxide film semiconductor (CMOS). Black stripes for isolating each pixel may be formed on these supports.

An undercoat layer may be provided on the support for improving adhesive property to the upper layers, for preventing diffusion of substances, and for planarizing the surface of the support.

Any developers may be used so long as they comprise a composition that is able to dissolve non-cured portions of the colored curable composition of the invention while the cured portions are left undissolved. Specifically, a combination of various organic solvents and an aqueous alkali solution may be used. The solvents used for preparing the colored curable composition of the invention may be also used for the developer.

As the aqueous alkali solution, an aqueous alkali solution which dissolved an alkali compound in the concentration of 0.001 to 10% by mass (preferably 0.01 to 1% by mass) is preferred. Examples of the alkali compound include sodium hydroxide, potassium hydroxide, sodium carbonate, sodium silicate, sodium methanesilicate, ammonia water, ethylamine, diethylamine, dimethylethanolamine, tetramethylammonium hydroxide, tetraethylanumonium hydroxide, choline, pyrrole, piperidine, and 1,8-diazabicyclo-[5.4.0]-7-undecene. When a developing solution prepared from such an aqueous alkali solution was used, generally after the development, the developing solution is washed with water.

The color filter of the invention can be used for the liquid crystal display (LCD) and solid state image pick-up element (for example CCD and CMOS). The color filter is suitable for a high resolution CCD element and CMOS having 1,000,000 pixels or more. The color filter of the invention may be used by disposing between the light-receiving part of the pixels and micro-lenses for converging the light constituting the CCD.

EXAMPLES

Hereinbelow, the invention will be described in detail by way of Examples. However, the invention is not limited to these Examples as long as the scope of the invention is not impaired. In the description of examples, unless otherwise specified, "parts" refers to parts by mass, and "%" means % by mass.

Example 1

(1) Synthesis of Dye Polymer

Dye polymer AP-1 was synthesized according to the following reaction scheme.

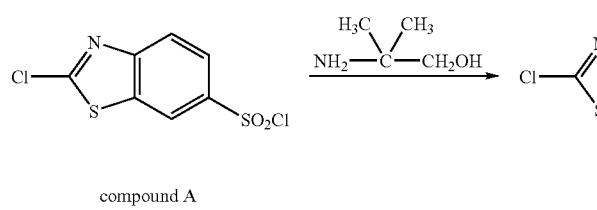

compound A          compound B

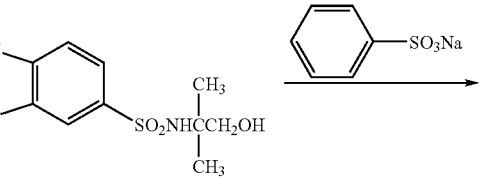

compound C

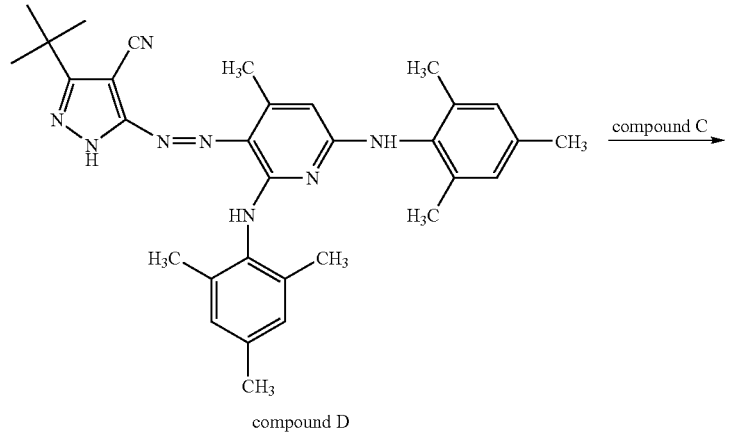

compound D

-continued
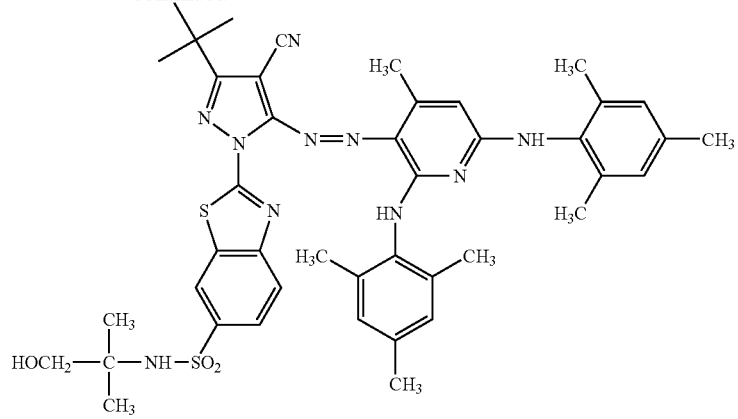
compound E
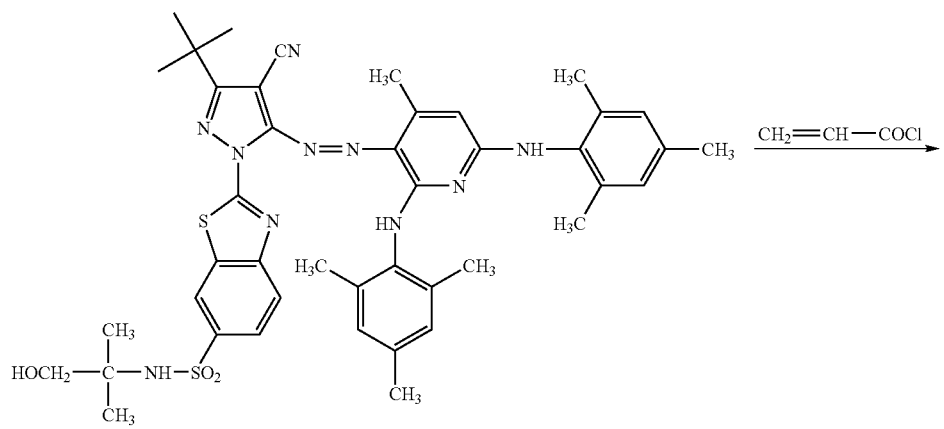
compound E
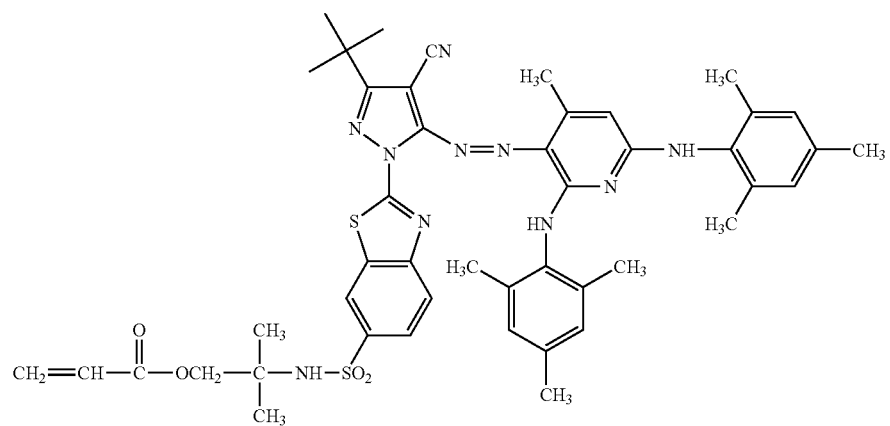
exemplary pigment monomer A-1

-continued

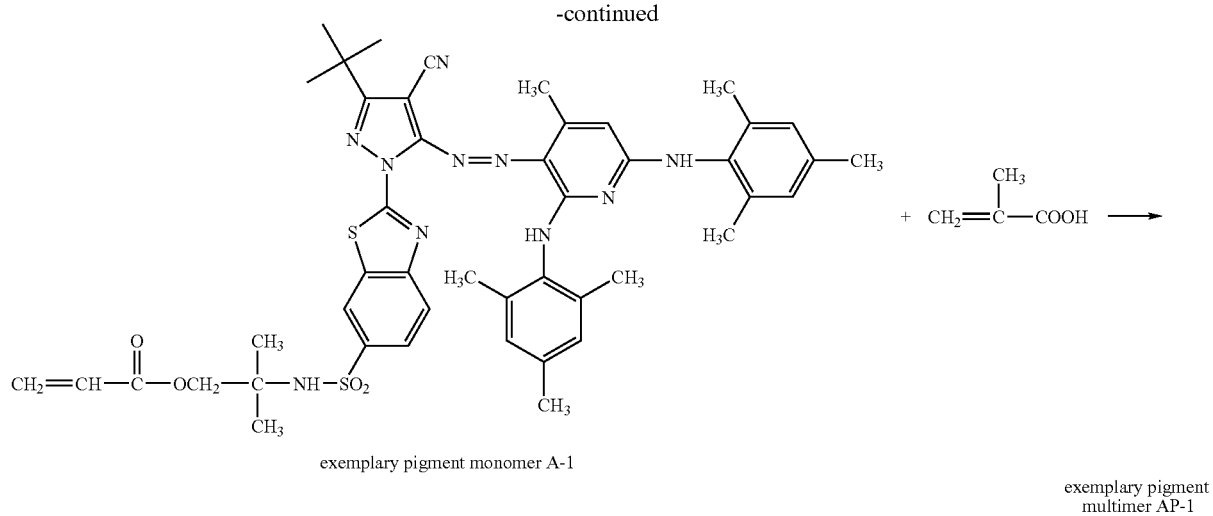

exemplary pigment monomer A-1 exemplary pigment multimer AP-1

(Synthesis of Compound B)

To 134 g (0.5 mol) of compound A, 1000 ml of acetonitrile was added, and cooled to 0° C. and stirred. In this solution, 53.5 g (0.6 mol) of 2-amino-2-methyl propanol was dropped. Further, in this solution, 60.7 g (0.6 mol) of triethylamine was dropped. The solution temperature was kept at 10° C. or lower. After dropping, the solution was stirred for 1 hour. After termination of reaction, the reaction solution was stirred and poured in 1500 ml of water, and crystals were deposited. The crystals were filtered, washed in water, and dried. As a result, 117.6 g of compound B was obtained (yield: 73.6%).

(Synthesis of Compound C)

To 32.0 g (0.1 mol) of compound B thus obtained, 100 ml of N-methyl pyrrolidone was added, and stirred at room temperature. In this solution, 30.0 g (0.15 mol) of sodium benzene sulfinate dihydrate was added. This solution was heated at 40 to 50° C., and stirred for 2 hours. The reaction solution was stirred and dropped in 1000 ml of water. The deposited crystals were filtered, washed in water, and dried. As a result, 40.3 g of compound C was obtained (yield: 94.5%).

(Synthesis of Compound E)

To 16.04 g (0.03 mol) of compound D synthesized according to the method disclosed in JP-A No. 2002-371079, 16 ml of ethyl acetate and 32 ml of dimethyl sulfoxide were added, and stirred at room temperature. In this solution, 8.29 g (0.06 mol) of potassium carbonate was added. Further, 14.5 g (0.034 mol) of compound C obtained above was added. This solution was heated to 40 to 45° C., and stirred for 5 hours. After termination of reaction, 200 ml of ethyl acetate and 500 ml of water were added and extracted. This ethyl acetate solution was washed by using a saturated saline solution, and ethyl acetate was distilled away under reduced pressure. The residue was separated and refined by silica gel column chromatography (eluate: n-hexane/ethyl acetate=4/1). In the isolated matter, 100 ml of acetonitrile was added, and stirred, and crystals were deposited. The deposited crystals were filtered and dried. As a result, 13 g of compound E was obtained (yield: 52.9%).

(Synthesis of Exemplary Pigment Monomer A-1)

To 30 g (0.0366 mol) of the compound E obtained above, 120 ml of ethyl acetate, 50 ml of dimethyl acetamide, and 0.5 ml of p-nitrobenzene were added, and stirred at room temperature. In this solution, 5.0 g (0.0552 mol) of acrylic chloride was dropped. This solution was stirred at room temperature for 5 hours, and stirred and poured into 500 ml of water, and crystals were deposited. The crystals were filtered, washed in water and dried. The crystals were recrystalized in 200 ml of acetonitrile, and refined. As a result, 22.0 g of exemplary pigment monomer A-1 was obtained (yield: 68.8%).

(Synthesis of Exemplary Dye Polymer AP-1)

22 g (0.0252 mol) of the exemplary pigment monomer A-1 obtained above, 2.17 g (0.0252 mol) of methacrylic acid, and 75 ml of dimethyl acetamide were mixed, and heated and stirred at 80° C., while nitrogen gas was being passed. In this solution, 1.0 g of V-65 (manufactured by Wako Pure Chemical Industries, Ltd.) was added. This solution was stirred for 2 hours at 80° C. to 85° C. Further, 1.0 g of V-65 was added in this solution again, and the solution was stirred for 2 hours. Moreover, 0.3 g of V-65 was added. After termination of addition, the solution was heated to 100° C. to 105° C., and stirred for 2 hours. After termination of reaction, the reaction solution was cooled to room temperature. It was then stirred and dropped in 2000 ml of water. The deposited solid matter was filtered, washed in water and dried. The obtained solid matter was dissolved in 200 ml of ethyl acetate. It was dropped in 400 ml of n-hexane, and deposited again. The same operation (deposition) was repeated, and unreacted raw material (exemplary pigment monomer A-1) was removed, and the solid matter was refined. As a result, 9.6 g of exemplary dye polymer AP-1 was obtained. Weight-average molecular weight of this exemplary dye polymer was 12000. In ethyl acetate solution, the maximum absorption wavelength ($\lambda$max) of the exemplary dye polymer was 539.4 nm. Absorption coefficient per weight of the exemplary dye polymer was 39200.

(2) Preparation of Resist Solution for Undercoat Layer

The following components were mixed and dissolved, and a resist solution for undercoat layer was prepared.

Propylene glycol monomethyl ether acetate (PGMEA): 5.20 parts

Cyclohexane: 52.6 parts

Binder (41% EL solution of benzyl methacrylate/methacrylic acid/methacrylic acid-2-hydroxyethyl copolymer, molar ratio=60:20:20): 30.5 parts Dipentaerythritol hexacrylate: 10.2 parts Polymerization inhibitor (p-methoxy phenol): 0.006 parts Fluorine-based surfactant (F-475, manufactured by DAIN-IPPON INK AND CHEMICALS, INC.): 0.80 parts Photopolymerization initiator (TAZ-107, trihalomethyl triazine-based photopolymerization initiator, manufactured by Midori kagaku Co., Ltd.): 0.58 parts (3) Preparation of Glass Support with Undercoat Layer Glass support (Corning 1737) was ultrasonically cleaned in 0.5% NaOH water. It was then washed with water, dewatered, and baked (200° C./20 minutes). The resist solution for undercoat layer obtained in (2) was applied on the cleaned glass support in a film thickness of 2 μm by using spin coater. After application, the glass support was heated and dried for 1 hour at 220° C., and a cured film (undercoat layer) was obtained.

(4) Preparation of Dye Resist Solution R-1 (Colored Curable Composition, Negative Type)

The following composition R-1 was mixed and dissolved, and a dye resist solution R-1 was prepared.

[Composition R-1]

Cyclohexane: 60 parts

Ethyl lactate: 20 parts

Binder (benzyl methacrylate/methacrylic acid, molar ratio 70/30): 1.0 parts

Exemplary dye polymer AP-1 (dye polymer of the invention): 8.5 parts

Polymerization inhibitor (p-methoxy phenol): 0.005 parts

Fluorine-based surfactant (F-475, manufactured by DAIN-IPPON INK AND CHEMICALS, INC.): 0.005 parts Dipentaerythritol hexacrylate: 6.8 parts Photopolymerization initiator CG-124 (manufactured by Ciba Specialty Chemicals): 3.2 parts (5) Exposure and Development of Resist (Formation of Image)

Dye resist solution R-1 obtained in "(4) Preparation of dye resist solution R-1" was applied on the undercoat layer of glass support with undercoat layer obtained in "(3) Preparation of glass support with undercoat layer", in a film thickness of 1.0 μm by using spin coater. After application, it was prebaked for 120 seconds at 100° C.

Using an exposure device, the coated film was exposed by 500 mJ/cm$^2$ through mask having linewidth of 20 μm at wavelength of 365 nm. After exposure, by using a developing solution of 60% CD-2000 (manufactured by FUJI FILM Electronic Materials Co., Ltd.) developing solution, it was developed in the condition of 25° C. and 40 seconds. It was then rinsed in running water for 30 seconds, and sprayed drying.

As a result, a suitable pattern for the color filter of cyan color was obtained.

(6) Evaluation

Stability over time of the prepared dye resist solution R-1, and the thermal resistance and light-fastness of the coat film applied on the glass support by using the dye resist solution R-1 was evaluated as follows. Results of evaluation are shown in Table 1.

<Stability Over Time>

Dye resist solution R-1 was stored for 1 month at room temperature, and degree of deposition of foreign matter was observed visually, and the stability over time was evaluated by the following criterion.

-Criterion for Evaluation-

A: no deposition

B: slight deposition

C: obvious deposition

<Thermal Resistance>

Glass plate on which the dye resist solution R-1 was applied was heated for 1 hour at 200° C. by using hot plate. Using color meter MCPD-1000 (manufactured by OTSUKA ELECTRONICS CO., LTD.), ΔEab value of color difference before and after heat test was measured, and evaluated by the following criterion. Thermal resistance is superior when ΔEab value is smaller.

-Criterion for Evaluation-

A: ΔEab value <5 or less

B: 5≦ΔEab value≦10

C: 10<ΔEab value

<Light-Fastness>

Glass plate on which the dye resist solution R-1 was applied was exposed by a xenon lamp for 20 hours at 50000 lux (equivalent to 1,000,000 lux-h). ΔEab value of color difference before and after light test was measured. Light-fastness is superior when ΔEab value is smaller.

-Criterion for Evaluation-

A: ΔEab value <3

B: 3≦ΔEab value ≦10

C: 10<ΔEab value

Examples 2 to 24

In "(4) Preparation of dye resist solution R-1" in example 1, the same manner as in example 1 was carried out, except that exemplary dye polymer AP-1 was replaced by the equivalent mass of exemplary dye polymers shown in Table 1. Results are shown in Table 1.

Comparative Examples 1 to 3

In "(4) Preparation of dye resist solution R-1" in example 1, the same manner as in example 1 was carried out, except that exemplary dye polymer AP-1 was replaced by following comparative dyes D-1, D-2, or D-3 shown in Table 1. Results are shown in Table 1.

TABLE 1

| Example | Exemplary Pigment multimer | Stability over time | Thermal resistance | Light-fastness |
| --- | --- | --- | --- | --- |
| Example 1 | AP-1 | A | A | A |
| Example 2 | AP-2 | A | A | A |
| Example 3 | AP-3 | A | A | A |
| Example 4 | AP-4 | A | A | A |
| Example 5 | AP-5 | A | A | A |
| Example 6 | AP-6 | A | A | A |
| Example 7 | AP-7 | A | A | A |
| Example 8 | AP-11 | A | A | A |
| Example 9 | AP-16 | A | A | A |

TABLE 1-continued

| Example | Exemplary Pigment multimer | Stability over time | Thermal resistance | Light-fastness |
|---|---|---|---|---|
| Example 10 | AP-20 | A | A | A |
| Example 11 | AP-21 | A | A | A |
| Example 12 | AP-28 | A | A | A |
| Example 13 | AP-29 | A | A | A |
| Example 14 | AP-38 | A | A | A |
| Example 15 | AP-48 | A | A | A |
| Example 16 | AP-51 | A | A | A |
| Example 17 | BP-1 | A | A | A |
| Example 18 | BP-2 | A | A | A |
| Example 19 | BP-3 | A | A | A |
| Example 20 | BP-23 | A | A | A |
| Example 21 | CP-1 | A | A | A |
| Example 22 | CP-2 | A | A | A |
| Example 23 | CP-10 | A | A | A |
| Example 24 | CP-16 | A | A | A |
| Comparative Example 1 | D-1 | C | C | C |
| Comparative Example 2 | D-2 | A | A | A |
| Comparative Example 3 | D-3 | A | A | A | comparative dye D-1

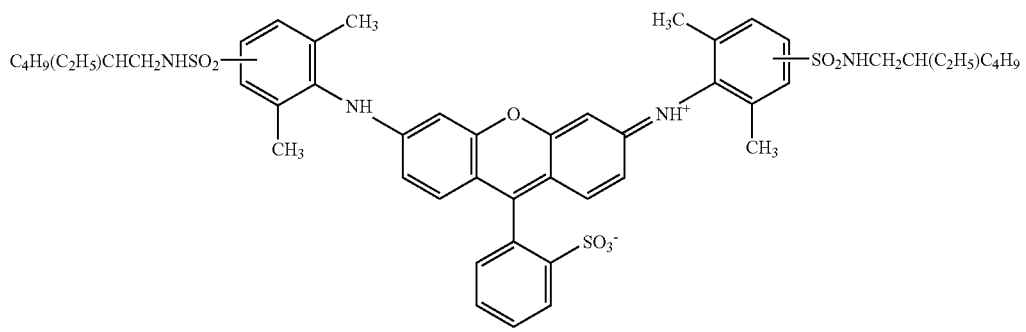

comparative dye D-2

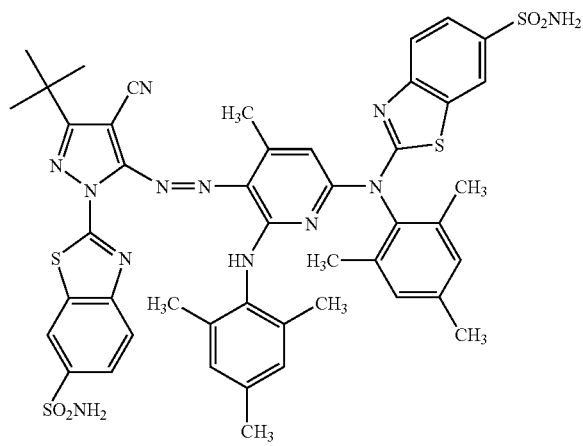

TABLE 1-continued

| Example | Exemplary Pigment multimer | Stability over time | Thermal resistance | Light-fastness |
| --- | --- | --- | --- | --- | comparative dye D-3

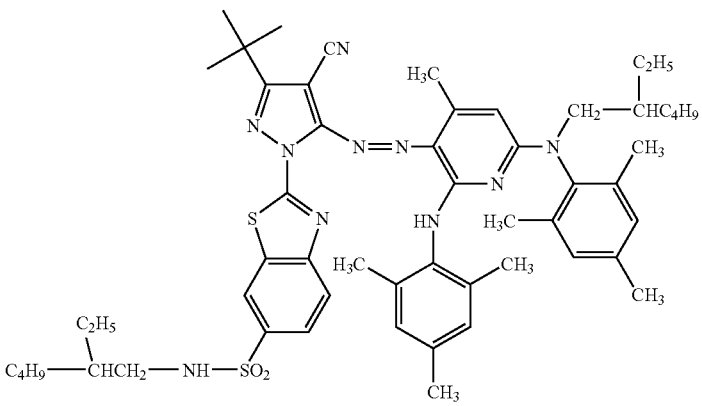

As shown in the results in Table 1, colored curable compositions of the examples using the dye polymers of the invention were excellent in stability overe time in solution state. Image patterns formed by using these colored curable compositions were excellent in both thermal fastness and light-fastness.

Decoloring resistance is evaluated in the following examples 25 to 48 and comparative examples 4 to 6.

Example 25

(7) Preparation of Resist Solution for Undercoat Layer

The following components were mixed and dissolved, and a resist solution for undercoat layer was prepared.

Propylene glycol monomethyl ether acetate (POMEA): 19.20 parts

Ethyl lactate: 36.67 parts

Binder (41% PGMEA solution of benzyl methacrylate/methacrylic acid/methacrylic acid-2-hydroxyethyl copolymer, molar ratio=60:20:20): 30.51 parts Dipentaerythritol hexacrylate (photopolymerizable compound): 12.20 parts Polymerization inhibitor (p-methoxy phenol): 0.0061 parts Fluorine-based surfactant (F-475, manufactured by DAINIPPON INK AND CHEMICALS, INC.): 0.80 parts Photopolymerization initiator (TAZ-107, trihalomethyl triazine-based photopolymerization initiator, manufactured by Midori kagaku Co., Ltd.): 0.586 parts (8) Preparation of Glass Support with Undercoat Layer Glass support (Corning 1737) was ultrasonically cleaned in 1% NaOH water. It was then washed with water, dewatered, and baked (200° C., 30 minutes). The resist solution obtained in "(7) Preparation of resist solution for undercoat layer" was applied on the cleaned glass support in a film thickness of 2.0 μm by using spin coater. It was heated and dried for 1 hour at 220° C., and a cured film (undercoat layer) was obtained.

(9) Preparation of Dye Resist Solution R-2 (Colored Curable Composition, Negative Type)

The following composition R-2 was mixed and dissolved, and dye resist solution R-2 was prepared.

[Composition R-2]

Cyclohexane: 60 parts

Ethyl lactate: 20 parts

Exemplary dye polymer AP-1 (dye polymer of the invention): 8.5 parts

Polymerization inhibitor (p-methoxy phenol): 0.005 parts

Fluorine-based surfactant (F-475: manufactured by DAINIPPON INK AND CHEMICALS: INC.): 0.005 parts Dipentaerythritol hexacrylate: 6.8 parts Photopolymerization initiator CG-124 (manufactured by Ciba Specialty Chemicals): 3.2 parts Dye resist solution R-2 obtained in "(9) Preparation of dye resist solution R-2" was applied on the undercoat layer of glass support with undercoat layer obtained in "(8) Preparation of glass support with undercoat layer", in a film thickness of 0.8 μm by using spin coater. After application, it was prebaked for 120 seconds at 100° C.

Using an exposure device, the coated film was exposed in full surface by 2000 mJ/cm$^2$ at wavelength of 365 nm. After exposure, using a developing solution of 60% CD-2000 (manufactured by FUJI FILM Electronic Materials Co., Ltd.), it was developed in the condition of 23° C. and 120 seconds. It was then rinsed in running water for 10 seconds, and sprayed drying. It was further post-baked for 300 seconds at 230° C.

In the example, the following experiment was conducted to evaluate decoloring resistance.

Spectrum of coated film after post-baking obtained above was measured (spectrum A). On this coated film, liquid removing dye (exemplary dye polymer AP-1) from the colored curable composition R-2 was applied in a film thickness of 1 μm, and pre-baked. Using CD-2000 developing solution, it was developed in the condition of 23° C. and 120 seconds, and spectrum was measured again (spectrum B). Dye residue rate was calculated from the difference of spectrum A and spectrum B. Decoloring resistance was evaluated by this dye residue rate. Solvent resistance is superior when this value is closer to 100%. Results are shown in Table 2.

Examples 26 to 48

In "(9) Preparation of dye resist solution R-2" in example 25, the same manner as in example 25 was carried, except that exemplary dye polymer AP-1 was replaced by the equivalent mass of exemplary dye polymers shown in Table 2. Results are shown in Table 2.

Comparative Examples 4 to 6

In "(9) Preparation of dye resist solution R-2" In Example 25, the same manner as in example 25 was carried, except that exemplary dye polymer was replaced by comparative dyes D-1, D-2, or D-3 shown in Table 2. Results are shown in Table 2.

TABLE 2

| Example | Exemplary pigment multimer | Decoloring resistance |
|---|---|---|
| Example 25 | AP-1 | 99% |
| Example 26 | AP-2 | 100% |
| Example 27 | AP-3 | 100% |
| Example 28 | AP-4 | 99% |
| Example 29 | AP-5 | 100% |
| Example 30 | AP-6 | 100% |
| Example 31 | AP-7 | 98% |
| Example 32 | AP-11 | 99% |
| Example 33 | AP-16 | 96% |
| Example 34 | AP-20 | 95% |
| Example 35 | AP-21 | 98% |
| Example 36 | AP-28 | 100% |
| Example 37 | AP-29 | 99% |
| Example 38 | AP-38 | 95% |
| Example 39 | AP-48 | 100% |
| Example 40 | AP-51 | 97% |
| Example 41 | BP-1 | 95% |
| Example 42 | BP-2 | 98% |
| Example 43 | BP-3 | 96% |
| Example 44 | BP-23 | 96% |
| Example 45 | CP-1 | 95% |
| Example 46 | CP-2 | 98% |
| Example 47 | CP-10 | 97% |
| Example 48 | CP-16 | 100% |
| Comparative example 4 | D-1 | 95% |
| Comparative example 5 | D-2 | 71% |
| Comparative example 6 | D-3 | 62% |

As shown in the results in Table 2, colored curable compositions of the examples containing the dye polymers of the invention could sufficiently suppress decoloring when a subsequent color pattern is coated superposed on a pattern that has already been formed in spite of high dye concentration.

By using the colored curable compositions containing the dye polymers of the invention, a color filter suppressed in decoloring can be provided.

According to the invention, a dye polymer excellent in thermal fastness and light-fastness and also excellent in ability not to precipitate out when prepared as dissolved solution, can be provided.

According to the invention, a colored curable composition excellent in thermal fastness, light-fastness, and stability over time, and suppressed in decoloring of dye by coating superposing on a pattern that has already been formed, can be provided.

According to the invention, a color filter excellent in thermal fastness and light-fastness, and a method of producing thereof can be provided.

The present invention includes the following embodiment.
<1> A dye polymer prepared by polymerizing one or more pigment monomer represented by formula (I), or by copolymerizing one or more pigment monomer represented by formula (I) and one or more monomer having one ethylene group,

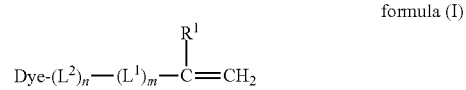

In the formula (I), $R^1$ is a hydrogen atom, a chlorine atom, an alkyl group, or an aryl group; $L^1$ is $-N(R^2)C(=O)-$, $-OC(=O)-$, $-C(=O)N(R^2)-$, $-C(=O)O-$, or a group represented by formula (II), formula (III), or formula (IV); $R^2$ is a hydrogen atom, an alkyl group, an aryl group, or a hetero cyclic group; $L^2$ is a divalent group for coupling $L^1$ or $-C(R^1)=CH_2$ group and Dye; n is 0 or 1; m is 0 or 1; and Dye is a pigment residue obtained by removing one arbitrary hydrogen atom from a group represented by formula (V),

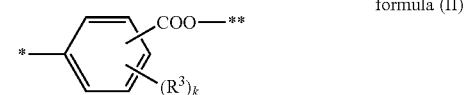

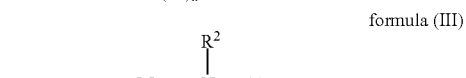

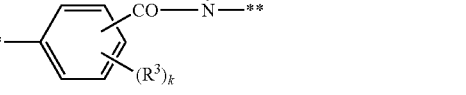

In the formula (II), (III) and (IV), $R^2$ is a hydrogen atom, an alkyl group, an aryl group, or a hetero cyclic group; $R^3$ is a substituent; k is an integer from 0 to 4; "*" is a coupling position with $-C(R^1)=CH_2$ group in formula (I); "**" is a coupling position with $L^2$ or Dye (in the case of n=0) in formula (I),

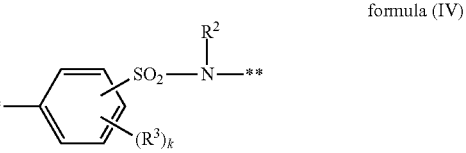

pigment residue

In the formula (V), A is an aryl, or a 5- or 6-memberd aromatic hetero cyclic residue; $B^1$ and $B^2$ are each independently $=N-$ or $=CR^6-$; $R^6$ is a hydrogen atom or a substituent; $R^4$ and $R^5$ are each independently a hydrogen atom, an alkyl group, an aryl group, a hetero cyclic group, an acyl group, an alkoxycarbonyl group, an aryloxycarbonyl group, a carbamoyl group, an alkylsulfonyl group, an arylsulfonyl group, or a sulfamoyl group; G is a hydrogen atom or a substituent; $R^4$ and $R^6$, or $R^4$ and $R^5$ may be coupled to form a 5- to 7-memberd ring, and any one of A, G, $R^4$, $R^5$, or $R^6$ is coupled with $-(L^2)_n-(L^1)_m-C(R^1)=CH_2$ in formula (I).

<2> The dye polymer according to claim 1, wherein the Dye in formula (I) is a pigment residue obtained by removing one arbitrary hydrogen atom from formula (VI),

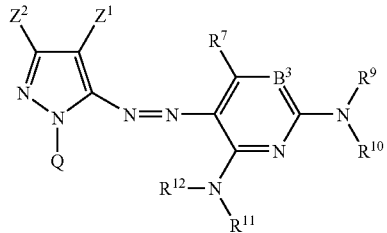

formula (VI)

In the formula (VI), $Z^1$ is an electron-attracting group having a Hammett's substituent constant $\sigma_p$ value of 0.20 or more; $Z^2$ is a hydrogen atom or a substituent; Q is an alkyl group, an aryl group, or a hetero cyclic group; $B^3$ is =N—, or =$CR^8$—; $R^8$ is a hydrogen atom or a substituent; $R^7$ is a hydrogen atom or a substituent; $R^9$, $R^{10}$, $R^{11}$, and $R^{12}$ are each independently a hydrogen atom, an alkyl group, an aryl group, a hetero cyclic group, an acyl group, an alkoxycarbonyl group, an aryloxycarbonyl group, a carbamoyl group, an alkylsulfonyl group, an arylsulfonyl group, or a sulfamoyl group; $R^7$ and $R^8$, $R^8$ and $R^9$, $R^9$ and $R^{10}$, and $R^{11}$ and $R^{12}$ may be mutually coupled to form a 5- to 7-membered ring; and any one of $Z^1$, $Z^2$, Q, or $R^7$ to $R^{12}$ is coupled with -$(L^2)_n$-$(L^1)_m$-C$(R^1)$=$CH_2$ in formula (I).

<3> A colored curable composition comprising at least one of the dye polymers as described in <1>.

<4> A color filter formed by using the colored curable composition as described in <3>.

<5> A method of producing a color filter comprising: coating the colored curable composition as described in <3> onto a support; then exposing through a mask; and developing to form a patterned image.

<6> The dye polymer as described in <1> or <2>, wherein $R^1$ in formula (I) is a hydrogen atom, a chlorine atom, an alkyl group having 1 to 6 carbon atoms, or an aryl group having 6 to 12 carbon atoms.

<7> The dye polymer as described in <1>, <2> or <6>, wherein, in formula (I), $R^1$ is a hydrogen atom, a chlorine atom, or an alkyl group; $L^1$ is —N($R^2$)C(=O)—, —OC(=O)—, or a group represented by formula (II), formula (III), or formula (IV); $R^2$ is a hydrogen atom, an alkyl group, or an aryl group; m is 1; $L^2$ is an alkylene group, an aralkylene group, an arylene group, —O—, —OC(=O)O—, —OC(=O)O—, —OC(=O)N($R^{50}$)—, —N($R^{50}$)C(=O)—, —N($R^{50}$)SO$_2$—, —S—, —SO$_2$—, or —SO$_2$N($R^{50}$)—; $R^{50}$ is a hydrogen atom, an alkyl group, or aryl group; and n is 0 or 1.

<8> The dye polymer as described in <7>, wherein $R^1$ is a hydrogen atom or an alkyl group; $L^1$ is —N($R^2$)C(=O)—, or —OC(=O)—; $R^2$ is a hydrogen atom or an alkyl group; and $R^{50}$ is a hydrogen atom or an alkyl group.

<9> The dye polymer as described in any one of <1>, <2>, and <6> to <8>, wherein, in formula (V), $R^4$ and $R^5$ are each independently a hydrogen atom, an alkyl group, an aryl group, a hetero cyclic group, an alkylsulfonyl group, an arylsulfonyl group, or an acyl group ($R^4$ and $R^5$ are not both hydrogen atoms); G is a hydrogen atom, a halogen atom, an alkyl group, a hydroxyl group, an amino group, or an amido group; A is a pyrazole ring, an imidazole ring, an isothiazole ring, a thiadiazole ring, or a benzothiazole ring; $B^1$ and $B^2$ are each independently —N= or —C($R^6$)=; $R^6$ is a hydrogen atom, a halogen atom, a cyano group, a carbamoyl group, a carboxyl group, an alkyl group, a hydroxyl group, or an alkoxy group.

<10> The dye polymer as described in <9>, wherein $R^4$ and $R^5$ are each independently a hydrogen atom, an aryl group, a hetero cyclic group, an alkylsulfonyl group, or an arylsulfonyl group ($R^4$ and $R^5$ are not both hydrogen atoms); G is a hydrogen atom, a halogen atom, an amino group, or an amido group; A is a pyrazole ring or an isothiazole ring; $B^1$ and $B^2$ are each independently —N= or —C($R^6$)=; $R^6$ is a hydrogen atom, a cyano group, a carbamoyl group, or an alkyl group.

<11> The dye polymer as described in any one of <2> and <6> to <10>, wherein, in formula (VI), $Z^1$ is a cyano group, an alkoxy carbonyl group, a carbamoyl group, a perfluoroalkyl group, an alkylsulfonyl group, an arylsulfonyl group, or a hetero cyclic group; $Z^2$ is a hydrogen atom, an alkyl group, an aryl group, an alkoxy group, an aryloxy group, a cyano group, an amido group, an amino group, an alkoxycarbonyl amino group, a carbamoyl amino group, an alkoxycarbonyl group, an alkylthio group, an arylthio group, an alkylsulfonyl group, an arylsulfonyl group, or a hetero cyclic group; Q is an aryl group or a hetero cyclic group; $R^7$ is a hydrogen atom, a halogen atom, an alkyl group, an aryl group, an alkoxy group, a hydroxyl group, an amino group, or an amido group; $B^3$ is =N—, or =C($R^8$)—; $R^8$ is a hydrogen atom, an alkyl group, a cyano group, an alkoxycarbonyl group, or a carbamoyl group; $R^9$, $R^{10}$, $R^{11}$, and $R^{12}$ are each independently a hydrogen atom, an alkyl group, an aryl group, a hetero cyclic group, an acyl group, an alkoxycarbonyl group, a carbamoyl group, an alkylsulfonyl group, or an arylsulfonyl group ($R^9$ and $R^{10}$ are not both hydrogen atoms, and $R^{11}$ and $R^{12}$ are not both hydrogen atoms).

<12> The dye polymer as described in <11>, wherein in formula (VI), $Z^1$ is a cyano group, an alkoxycarbonyl group, a carbamoyl group, a trifluoromethyl group; $Z^2$ is a hydrogen atom, an alkyl group, an aryl group, an amido group, an amino group, an alkoxycarbonyl group, an alkylthio group, an arylthio group, or a hetero cyclic group; Q is a hetero cyclic group; $R^7$ is a hydrogen atom or an alkyl group; $B^3$ is =N—, or =C($R^8$)—; $R^8$ is a hydrogen atom or an cyano group; $R^9$ is an alkyl group, an aryl group, or a hetero cyclic group; $R^{10}$ is a hydrogen atom, an alkyl group, an aryl group, or a hetero cyclic group; $R^{11}$ is a hydrogen atom; and $R^{12}$ is an alkyl group or an aryl group.

<13> The dye polymer as described in any one of <1>, <2>, and <6> to <12>, wherein the monomer having one ethylene group is acrylic acid, methacrylic acid, an acrylic ester, a methacrylic ester, an acrylamide, a methacrylamide, or a styrene.

<14> The dye polymer as described in any one of <1>, <2>, and <6> to <13>, wherein the proportion of the pigment monomer in the dye polymer is 50 to 100%.

<15> The colored curable composition as described in <3>, further comprising: an alkali-soluble binder; a further monomer; and a photopolymerization initiator; wherein the colored curable composition composes a negative working composition.

<16> The colored curable composition as described in <3> or <15>, further comprising: an alkali-soluble binder; and a naphthoquinone diazide compound; wherein the colored curable composition composes a positive working composition.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

All publications, patent applications, and technical standards mentioned in this specification are herein incorporated by reference to the same extent as if each individual publication, patent application, or technical standard was specifically and individually indicated to be incorporated by reference.

What is claimed is:

1. A colored curable composition comprising:
at least one dye polymer prepared by polmerizing one or more pigment monomers represented by formula (I), or by copolmerizing one or more pigment monomers represented by formula (I) and one or more monomers having one ethylene group,

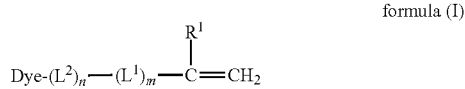

formula (I)

wherein in formula (I): $R^1$ is a hydrogen atom, a chlorine atom, an alkyl group, or an aryl group; $L^1$ is $-N(R^2)C(=O)-$, $-OC(=O)-$, $-C(=O)N(R^2)-$, $-C(=O)O-$, or a group represented by formula (II), formula (III), or formula (IV); $R^2$ is a hydrogen atom, an alkyl group, an aryl group, or a heterocyclic group; $L^2$ is a divalent group for coupling $L^1$ or $-C(R^1)=CH_2$ group and Dye; n is 0 or 1; m is 0 or 1; and Dye is a pigment residue obtained by removing one arbitrary hydrogen atom from a group represented by formula (V),

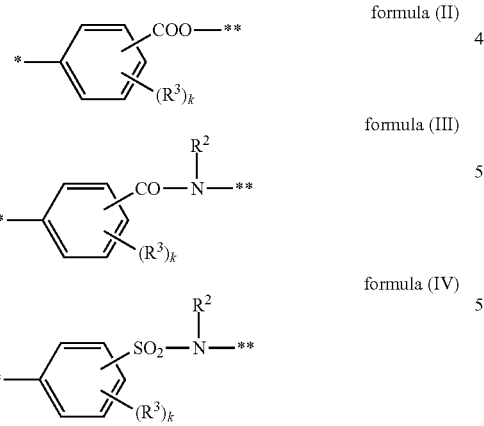

wherein in formulas (II), (III) and (IV): $R^2$ is a hydrogen atom, an alkyl group, an aryl group, or a hetero cyclic group; $R^3$ is a substituent; k is an integer from 0 to 4; "*" is a coupling position with $-C(R^1)=CH_2$ group in formula (I); "**" is a coupling position with $L^2$ or Dye (in the case of n=0) in formula (I),

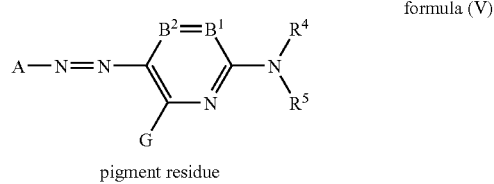

formula (V)

pigment residue wherein in formula (V): A is an aryl, or a 5- or 6-memberd aromatic hetero cyclic residue; $B^1$ and $B^2$ are each independently $=N-$ or $=CR^6-$; $R^6$ is a hydrogen atom or a substituent; $R^4$ and $R^5$ are each independently a hydrogen atom, an alkyl group, an aryl group, a hetero cyclic group, an acyl group, an alkoxycarbonyl group, an aryloxycarbonyl group, a carbamoyl group, an alkylsulfonyl group, an arylsulfonyl group, or a sulfamoyl group; G is a hydrogen atom or a substituent; $R^4$ and $R^6$, or $R^4$ and $R^5$ may be coupled to form a 5- to 7-memberd ring, and any one of A, G, $R^4$, $R^5$, or $R^6$ is coupled with $-(L^2)_n-(L^1)_m-C(R^1)=CH_2$ in formula (I),
an alkali-soluble binder,
a further monomer, and
a photopolymerization initiator,
and wherein the colored curable composition composes a negative working composition.

2. The colored curable composition according to claim 1, wherein the Dye in formula (I) is a pigment residue obtained by removing one arbitrary hydrogen atom from formula (VI),

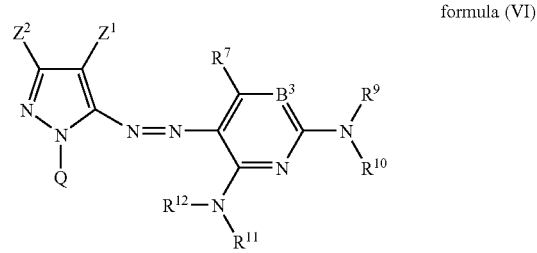

formula (VI)

wherein in formula (VI): $Z^1$ is an electron-attracting group having a Hammett's substituent constant $\sigma_p$ value of 0.20 or more; $Z^2$ is a hydrogen atom or a substituent; Q is an alkyl group, an aryl group, or a hetero cyclic group; $B^3$ is $=N-$, or $=CR^8 13$ ; $R^8$ is a hydrogen atom or a substituent; $R^7$ is a hydrogen atom or a substituent; $R^9$, $R^{10}$, $R^{11}$, and $R^{12}$ are each independently a hydrogen atom, an alkyl group, an aryl group, a hetero cyclic group, an acyl group, an alkoxycarbonyl group, an aryloxycarbonyl group, a carbamoyl group, an alkylsulfonyl group, an arylsulfonyl group, or a sulfamoyl group; $R^7$ and $R^8$, $R^8$ and $R^9$, $R^9$ and $R^{10}$, and $R^{11}$ and $R^{12}$ may be mutually coupled to form a 5- to 7-membered ring; and any one of $Z^1$, $Z^2$, Q, or $R^7$ to $R^{12}$ is coupled with $-(L^2)_n-(L^1)_m-C(R^1)=CH_2$ in formula (I).

3. The colored curable composition according to claim 2, wherein, in formula (VI), $Z^1$ is a cyano group, an alkoxy carbonyl group, a carbamoyl group, a perfluoroalkyl group, an alkylsulfonyl group, an arylsulfonyl group, or a hetero cyclic group; $Z^2$ is a hydrogen atom, an alkyl group, an aryl group, an alkoxy group, an aryloxy group, a cyano group, an amido group, an amino group, an alkoxycarbonyl amino group, a carbamoyl amino group, an alkoxycarbonyl group, an alkylthio group, an arylthio group, an alkylsulfonyl group, an arylsulfonyl group, or a hetero cyclic group; Q is an aryl group or a hetero cyclic group; $R^7$ is a hydrogen atom, a halogen atom, an alkyl group, an aryl group, an alkoxy group, a hydroxyl group, an amino group, or an amido group; $B^3$ is =N—, or =C($R^8$)—; $R^8$ is a hydrogen atom, an alkyl group, a cyano group, an alkoxycarbonyl group, or a carbamoyl group; $R^9$, $R^{10}$, $R^{11}$, and $R^{12}$ are each independently a hydrogen atom, an alkyl group, an aryl group, a hetero cyclic group, an acyl group, an alkoxycarbonyl group, a carbamoyl group, an alkylsulfonyl group, or an arylsulfonyl group ($R^9$ and $R^{10}$ are not both hydrogen atoms, and $R^{11}$ and $R^{12}$ are not both hydrogen atoms).

4. A color filter formed by using the colored curable composition according to claim 1.

5. A method of producing a color filter comprising:
   coating the colored curable composition according to claim 1 onto a support; then
   exposing through a mask; and
   developing to form a patterned image.

6. The colored curable composition according to claim 1, wherein, in formula (I), $R^1$ is a hydrogen atom, a chlorine atom, or an alkyl group; $L^1$ is —N($R^2$)C(=O)—, —OC(=O)—, or a group represented by formula (II), formula (III), or formula (IV); $R^2$ is a hydrogen atom, an alkyl group, or an aryl group; m is 1; $L^2$ is an alkylene group, an aralkylene group, an arylene group, —O—, —OC(=O)—, —OC(=O)O—, —OC(=O)N($R^{50}$)—, —N($R^{50}$) C(=O)—, —N($R^{50}$)SO$_2$—, —S—, —SO$_2$—, or —SO$_2$N($R^{50}$)—; $R^{50}$ is a hydrogen atom, an alkyl group, or aryl group; and n is 0 or 1.

7. The colored curable composition according to claim 1, wherein, in formula (V), $R^4$ and $R^5$ are each independently a hydrogen atom, an alkyl group, an aryl group, a hetero cyclic group, an alkylsulfonyl group, an arylsulfonyl group, or an acyl group ($R^4$ and $R^5$ are not both hydrogen atoms); G is a hydrogen atom, a halogen atom, an alkyl group, a hydroxyl group, an amino group, or an amido group; A is a pyrazole ring, an imidazole ring, an isothiazole ring, a thiadiazole ring, or a benzothiazole ring; $B^1$ and $B^2$ are each independently —N= or —C($R^6$)=; $R^6$ is a hydrogen atom, a halogen atom, a cyano group, a carbamoyl group, a carboxyl group, an alkyl group, a hydroxyl group, or an alkoxy group.

8. The colored curable composition according to claim 1, wherein the monomer having one ethylene group is acrylic acid, methacrylic acid, an acrylic ester, a methacrylic ester, an acrylamide, a methacrylamide, or a styrene.

9. The colored curable composition according to claim 1, wherein the dye polymer has a weight-average molecular weight of 2,000 to 300,000.

10. The colored curable composition according to claim 1, wherein the pigment monomer in the dye polymer is present in an amount of 20 to 100%.

11. The colored curable composition according to claim 1, wherein the photopolymerization initiator comprises an oxime compound.

* * * * *